United States Patent [19]

Spence

[11] Patent Number: 5,333,069
[45] Date of Patent: Jul. 26, 1994

[54] TECHNIQUE FOR USE IN CONJUNCTION WITH AN IMAGING SYSTEM FOR PROVIDING AN APPEARANCE MATCH BETWEEN TWO IMAGES AND FOR CALIBRATING THE SYSTEM THERETO

[75] Inventor: John P. Spence, Webster, N.Y.
[73] Assignee: Eastman Kodak Company, Rochester, N.Y.
[21] Appl. No.: 905,598
[22] Filed: Jun. 26, 1992

Related U.S. Application Data

[63] Continuation-in-part of Ser. No. 834,076, Feb. 10, 1992.
[51] Int. Cl.$^5$ ............................................. G03F 3/08
[52] U.S. Cl. ..................................... 358/517; 358/518
[58] Field of Search ...................... 358/517, 508, 518; 356/390

[56] References Cited

U.S. PATENT DOCUMENTS

| | | | |
|---|---|---|---|
| 4,660,159 | 4/1987 | Ott | 364/526 |
| 4,665,496 | 5/1987 | Ott | 364/526 |
| 4,706,206 | 11/1987 | Benoit et al. | 364/526 |
| 4,708,459 | 11/1987 | Cowan et al. | 355/4 |
| 4,901,254 | 2/1990 | Dolezalek et al. | 364/526 |
| 4,975,862 | 12/1990 | Kellar et al. | 364/526 |
| 5,212,546 | 5/1993 | Arazi et al. | 358/80 |

OTHER PUBLICATIONS

"Gretag SPM50: A True Spectral Grating Spectrophotometer Offering the Operating Ease of a Densitometer", Gretag SPM50 spectrophotometer brochure.
F. Billmeyer, "Quantifying Color Appearance Visually and Instrumentally", Summaries of Papers Presented at the Color Appearance Topical Meeting *Optical Society of America*, 29–30 Jun. 1987, Annapolis, Maryland, pp. 4–7.
W. Cowan, "The Computational Approach to Colour Reproduction", *Summaries of Papers Presidented at the Color Appearance Topical Meeting Optical Society of America*, 29–30 Jun. 1987, Annapolis, Maryland, pp. 98–101.
J. Thornton et al., "High Resolution [Paint by Number]", *Summaries of Papers Presented at the Color Appearance Topical Meeting —Optical Society of America*, 29–30 Jun. 1987, Annapolis, Maryland, pp. 104–105.
F. N. Fritsch et al., "Monotone Piecewise Cubic Interpolation", *SIAM Journal of Numerical Analysis*, vol. 17, No. 2, Apr. 1980, pp. 238–246.

*Primary Examiner*—Stephen Brinich
*Attorney, Agent, or Firm*—Dennis R. Arndt

[57] ABSTRACT

Apparatus, and associated methods employed therein, for objectively providing an accurate appearance match between two depictions of a common images produced by two imaging systems (e.g. a target image (170) produced by one such system (160), e.g. a press sheet (178) generated by a printing press (168), which is to be matched by a replica image (150) produced by another such system (140), e.g. a proof (153) generated by a direct digital color halftone proofing system (143)) and thereby calibrate the performance of one imaging system, e.g. the proofing system, to that of the other system, e.g. the printing press. Specifically, measurement data, such as illustratively colorimetric CIELAB L*a*b* measurements, is obtained for the same portions of the press sheet and proof. This data is acquired in or transformed into a color space which encodes color information in a pre-defined manner that approximates human color perception. Thereafter, through use of a pre-determined model of the, e.g., proofing system, incorporated into pre-defined matching principles which objectively and quantitatively define an accurate appearance match between the depictions produced by both systems, operational settings for the proofing system, such as solid area densities and tint dot areas, are determined which will calibrate the response of the proofing system to that of the press. Consequently, tone and color rendition produced by the proofing system is modified to provide an accurate appearance match to that obtained, from a common image source, on the press, given judgmental color preferences of a human observer and performance limitations of the proofing system.

31 Claims, 16 Drawing Sheets

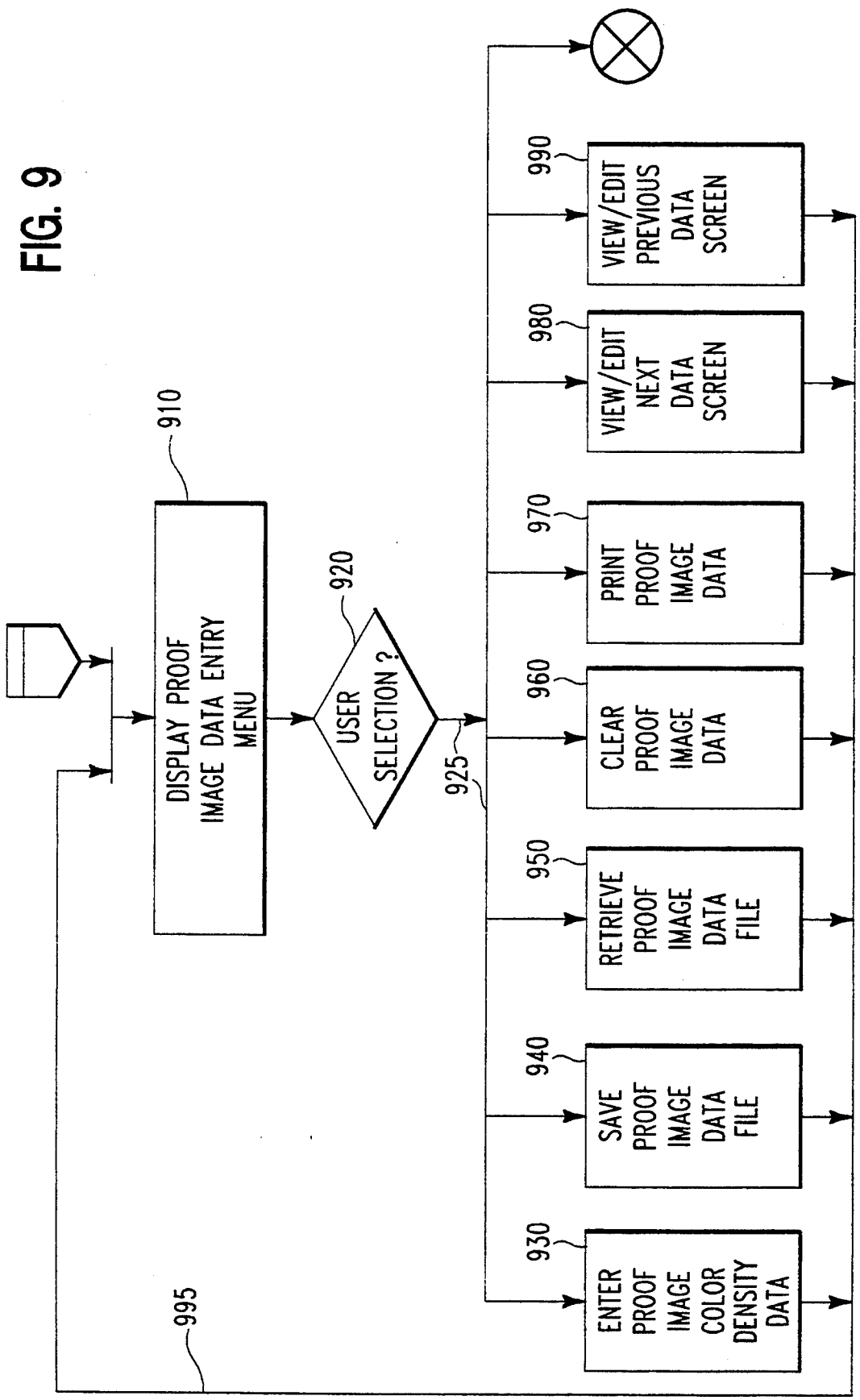

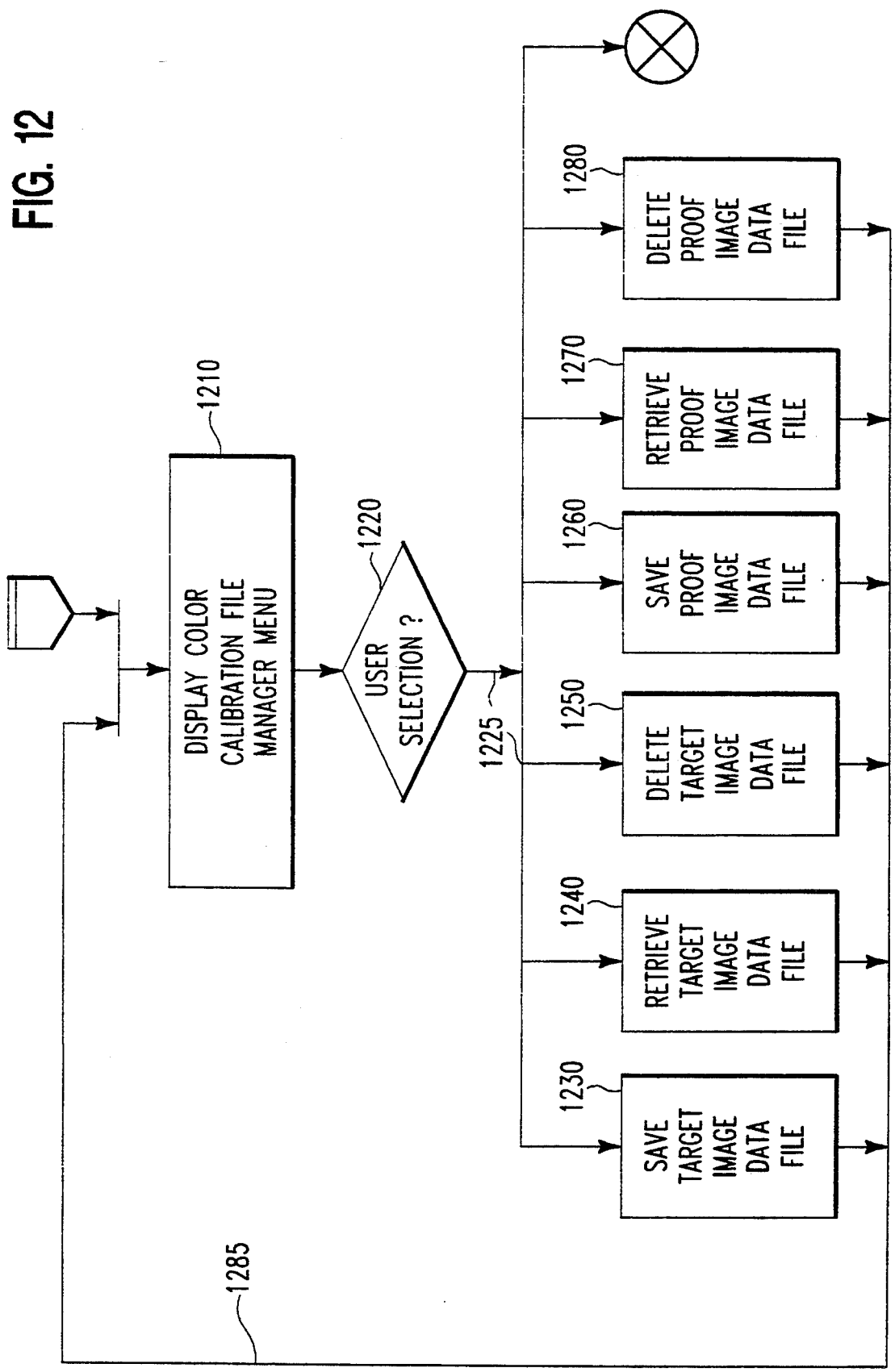

TECHNIQUE FOR USE IN CONJUNCTION WITH AN IMAGING SYSTEM FOR PROVIDING AN APPEARANCE MATCH BETWEEN TWO IMAGES AND FOR CALIBRATING THE SYSTEM THERETO

CROSS-REFERENCE TO RELATED APPLICATION

This application is a continuation-in-part of my co-pending United States patent application entitled "A TECHNIQUE FOR USE IN CONJUNCTION WITH AN IMAGING SYSTEM FOR PROVIDING AN APPEARANCE MATCH BETWEEN TWO IMAGES AND FOR CALIBRATING THE SYSTEM THERETO" filed Feb. 10, 1992, Ser. No. 07/834,076 and which has been assigned to the present assignee hereof.

TECHNICAL FIELD OF THE INVENTION

The invention relates to a technique, specifically apparatus and associated methods employed therein, for objectively providing an accurate appearance match between a depiction of an image produced by one imaging system (i.e. a "target" image produced by, e.g. a printing press) to a depiction of the same image but produced by a different imaging system (i.e. a "replica" of the target image but produced by, e.g., a halftone color proofing system) and thereby calibrate the performance of the latter system to that of the former system.

BACKGROUND ART

Currently, color images are generated through a wide variety of different systems, such as for example photographically on suitable film or photosensitive paper, or electronically on video tape or other suitable media. When generated, images share a basic characteristic: they are recorded on a continuous tone (hereinafter referred to as "contone") basis. As such, recorded color information at any point in the image is represented by several continuous amplitude values, each of which is oftentimes discretized as eight-bit values ranging from "0" to "255". Very often, a user having an image captured on one medium, such as a photographic print or transparency, will desire to display and/or reproduce that image on other media, such as on a video monitor or on a printed page.

Color reproduction equipment, as it relates to printing images, takes advantage of the principle that the vast majority of colors can be separated into a specific combination of four primary subtractive colors (specifically cyan, yellow, magenta and black—C, Y, M and K) in which the amount of each primary color is set to a predetermined amount. In the case of printed reproductions of an image, use of primary color printing obviates the need to use a differently colored ink for each different color in the image. As such, each image is commonly converted into sets of three or four color separations, in which each separation is essentially a negative (or positive) transparency with an altered tone reproducing characteristic that carries the color information for only one of the primary colors. Separations are subsequently recorded on printing plates for use in a press.

By way of contrast, color reproduction on cathode ray tube displays takes advantage of the principle that the vast majority of colors can be represented by a combination of three primary additive colors (specifically red, green and blue—R, G and B) in which the intensity produced by each primary colored (R, G or B) phosphor is set to a predetermined amount.

Modern offset printing presses do not possess the capability of applying differential amounts of ink to any location in an image being printed. Rather, these presses are only designed to either apply or not apply a single amount of ink to any given location on a page. Therefore, an offset printing press is unable to directly print a contone separation. To successfully circumvent this problem, halftone separations are used instead. An image formed from any single color halftone separation encodes the density information inherent in a color image from amplitude modulated form into a spatial (area) modulated form, in terms of dot size, which is subsequently integrated by the human eye into a desired color. By smoothly changing halftone dot sizes (dot areas), smooth corresponding tone variations will be generated in the reproduced image. Given this, the art has taught for some time that a full color image can be formed by properly overlaying single color halftone reproductions for all of the primary subtractive colors, where each reproduction is formed from a corresponding halftone dot separation that contains dots of appropriate sizes. Clearly, as size and spacing of the dots decrease, an increasing amount of detail can be encoded in a halftone dot pattern and hence in the reproduced image. For that reason, in graphic arts applications, a halftone separation utilizes closely spaced dots to yield a relatively high resolution.

With this in mind, one might first think that printing a color image for graphic arts use should be a fairly simple process. Specifically, a color image could first be converted into corresponding continuous tone separations. Each of these contone separations could then be converted into a corresponding halftone separation. A printing plate could then be manufactured from each halftone separation and subsequently mounted to a printing press. Thereafter, paper or other similar media could be run through the press in such a fashion so as to produce properly registered superimposed halftone images for all the subtractive primary colors thereby generating a full color reproduction of the original image.

In practice, accurately printing a color image is oftentimes a very tedious, problematic and time consuming manual process that requires a substantial level of skill. First, the conventional manual photographic process of converting a contone separation into a halftone separation, this process commonly being referred to as "screening", is a time and resource consuming process in and of itself. Second, various phenomena, each of which disadvantageously degrades an image, often occur in a reproduced halftone color image. Moreover, the complete extent to which each of these phenomena is present in the reproduced image is often known only at a rather late point in the printing process thereby necessitating the use of tedious and time and resource consuming iterative experimentation to adequately eliminate these phenomena.

Traditionally, on-press proofing provided the first point at which a color judgment could be made regarding the quality of the reproduced image. For example, many color differences, such as incompatible and/or objectionable color renditions or Moiré patterns, were usually first seen at this point in an imaging process. If such a difference were sufficiently objectionable to a color technician, then usually the entire imaging process would need to be modified and repeated. Doing so generally necessitated a total re-work of the separations, production of a new set of printing plates therefrom and generation of a new press proof, with this process being iteratively repeated as many times as necessary to properly remove or sufficiently attenuate the incompatible and/or objectionable color differences.

In an effort to reduce the time required and expense associated with conventional manual photographic based color reproduction processes and particularly the traditional on-press proofing techniques used therewith, the art has initially turned away from use of on-press proofing in high volume graphic art applications towards the use of intermediate off-press proofing technologies, such as electro-photographic techniques. In this regard, U.S. Pat. No. 4,708,459 (issued to C. Cowan et al on Nov. 24, 1987, assigned to the present assignee hereof and hereinafter referred to as the '459 Cowan et al patent) discloses an electro-photographic color proofing system with variable tone reproduction characteristics.

Now, for a variety of reasons, such as for example, recently increasing use of digital techniques in color electronic pre-press systems; and increasing flexibility, control and throughput over that provided by optical (including electro-photographic) proofing systems, the art appears to be turning towards the use of so-called direct digital color proofing (DDCP) systems. These particular systems directly generate a halftone color proof image from a set of digitized contone separations and particularly the digitized contone values therefor. Specifically, DDCP systems manipulate the separations in digital form to electronically generate appropriate halftone separations, including, inter alia, through use of electronic screening and tone reproduction compensation, and then directly write the proof image using an appropriate high resolution binary marking engine. Furthermore, inasmuch as these systems completely eliminate photographic film-based processes, these systems are expected to be very economical to operate.

By virtue of providing input-output mapping in a completely digital fashion, such DDCP systems should provide far better control over image subtleties and hence tone reproduction than that available through optical proofing systems known in the art.

In that regard, I have previously developed a technique for inclusion in, illustratively, a DDCP system that: (a) allows an operator to completely specify and readily change a desired tone reproduction curve shape that, within the physical limits of the system, is to be reproduced in the proof, and (b) causes the system produce a proof image that exhibits the desired dot gain curve shape. That technique is fully described in my co-pending U.S. patent application "A TECHNIQUE FOR USE IN CONJUNCTION WITH AN IMAGING SYSTEM FOR PROVIDING ACCURATE TONE REPRODUCTION IN AN OUTPUT IMAGE" filed Oct. 25, 1991, Ser. No. 07/782,940 (hereinafter referred to as the '940 Spence application) and which has been assigned to the present assignee hereof.

Very broadly speaking, this technique relies on intentionally varying the value of each incoming contone value by an amount consistent with both an actual tone reproduction characteristic of a DDCP imaging chain (i.e. a so-called "Process" dot gain) and a desired (so-called "Aim") dot gain to yield an output dot of an appropriate area that provides the desired density in the proof image. In this context, the DDCP imaging chain is illustratively formed of a raster image processor (RIP), which implements a screening process, and a marking engine connected thereto such as a sublimation dye transfer laser writer. To readily accomplish this variation, each incoming contone value is appropriately modified through illustratively a table look-up operation into a correspondingly modified value which, when subsequently rendered into a halftone pattern on the proof image by the marking engine, causes the proof to accurately exhibit the desired "Aim" tone reproduction curve. The look-up table contains values which represent the "Aim" tone reproduction curve modified by an inverse of the "Process" tone reproduction curve.

While the optical proofing system described in the '459 Cowan et al patent and the direct digital proofing system described in the '940 Spence application provide excellent quality proofs, these systems, like all imaging systems, can reproduce colors only within a certain color gamut. Generally speaking, the tone reproduction characteristics of one type of imaging system, or even one type of imaging medium, are not completely coincident with those of a different type of imaging system or medium. In this regard, through use of differing colorants (e.g. inks used in printing as compared to photographic dyes or colored phosphors on a video monitor) and other physical phenomena related to specific imaging processes, a given color shown on a color artwork, such as on a photograph, on any of a variety of other off-press proofs, on a press proof or on a press sheet printed on publication stock, will often appear differently in a halftone color proof formed either on electro-photographic film or on a dye transfer intermediate and subsequently transferred to paper. Furthermore, a halftone color proofing system, such as that described in the '459 Cowan et al patent or that described in the '940 Spence application, is generally incapable of producing the exact same color gamut and color response which are available through either the photograph, the other off-press proofs, the press proof or the press sheet. In this regard, the color gamut reproducible in a color halftone proof will generally not match that associated with a color artwork that appears on a photograph, an off-press proof, a press proof or on a press sheet. In addition and owing to physical differences among different imaging systems, the response of different types of imaging systems to an identical input color will likely be different, e.g. the same red color provided as input to two different imaging systems might likely produce two output colors with somewhat differing red hues.

In view of the inherent tone and color differences between, e.g., the press sheet and the proof thereof, the colors in the proof can not be identically matched to those that appear in the press sheet. Nevertheless, for a proofing system to fully serve its intended purpose, a proof image must be predictive of color rendition in images subsequently produced by another imaging system (hereinafter respectively referred to as a target images and target imaging systems). However, the tone and color reproduction characteristics of a proofing system rarely coincide with those of an associated target imaging system. Therefore, the tone and color reproduction characteristics of the proofing system must be calibrated, to the extent possible, to those of the target imaging system. Once calibrated, the proofing system should be able to accurately predict the performance of the target imaging system though, in most situations, the proofing system will generate a proof image with colors that do not exactly match those in a target image.

Unfortunately, calibrating a proofing system tends to consume an inordinate amount of time as well as require a very high level of skill. In this regard, a color technician is required to possess a substantial level of skill and expertise not only to judge color differences between a proof image and a target image therefor but also to fully appreciate performance inter-relationships between the colors that appear on the proof image and corresponding colors that will appear on the target image. Consequently, the technician not only must recognize a color difference and decide which specific colors to match but also, where the tone and color reproduction characteristics of the proofing system can be varied, determine the proper variations in these characteristics in order to achieve an acceptable match between the proof image and the target image and then set the proofing system accordingly.

In particular, to calibrate a proofing system to a target imaging system, a color technician usually visually examines both a proof image and an associated target image on a side-by-side basis and then, based upon his own subjective judgment as to what the visually important features of the target image are and how they should appear, selects which colors to match. Thereafter, given his knowledge of the proofing system and its color response, he will attempt to initially vary the C, Y, M and K colorant solid area densities and/or dot size (tone reproduction curve) settings to accurately depict one color(s), which, not surprisingly, will also affect other colors, possibly adversely. Based upon the effects that occur with respect to other colors in the proof image, the technician will iteratively vary solid area densities and/or dot size (tone reproduction curve) settings of the colorants, in seriatim, until an acceptable color match is achieved between the target image and the proof image for the selected colors.

However, a proofing system with variable tone and color reproduction characteristics often presents the technician with an enormous number of different possible combinations of the settings. For example, for the system described in the '459 Cowan et al patent, the solid area density and dot size can be set for each of the four process colors (C, Y, M and K) at any of 20 different density levels and at any of 15 different dot size settings. For the DDCP system described in the '940 Spence application, the number of solid area density settings is considerably larger, with, e.g., the number of dot size settings alone (comprising specification of several control points) numbering well into the thousands. In view of the resulting huge number of potential combinations of settings, an experienced color technician often needs to run and separately analyze quite a few successive proofs in order to select a suitable solid area density and halftone dot size setting (or an entire tone reproduction curve shape) for each different colorant in order to achieve an acceptable match between the proof image and a target image and thereby calibrate the proofing system to the target imaging system. Moreover, additional time is consumed whenever the technician is forced to resort to trial-and-error experimentation or, in a worst case scenario, guesswork: either merely as a result of iterating through a very large number of possible combinations to discern the performance inter-relationships of the proofing system and/or by incorrectly relying on intuition and initially iterating away from a proper operating condition. An example of the latter situation can occur where the technician, based upon his own intuition, views a proof image against a target image and decides that the yellow content in the proof image needs to be increased. While the technician may decide to initially increase the halftone dot size for the yellow colorant, the proper operating condition may instead involve reducing the halftone dot sizes for all the colorants but reducing the halftone dot size for yellow less than that for each of the other colorants.

Furthermore with certain images, the technician may simply have insufficient skill to quickly determine the proper operating conditions of the proofing system. As such, in certain situations, the technician, given his lack of knowledge or experience, may be unable to determine the best possible color match in the time allotted and thus must settle for a match that is often simply acceptable. In view of this, empirical approaches have been developed to aid the technician in quickly locating a limited region of the operating space of the proofing system in which a decent match can be achieved and to which the proofing system can be calibrated. One such empirical approach could involve first matching the C, M, Y and K solid area and halftone densities between the target image and the proof image to the extent realistically possible—though this may generally produce mismatches in overprint colors, e.g. the reds, greens and blues. Once these primary color matches are achieved, the resulting proof image is then visually examined to determine how certain overprint colors appear, e.g., whether gray tones are the same as those on the artwork or are too red. If the latter occurs, then the colorants are appropriately changed, possibly through successive iterative changes, to increase the cyan content or decrease the magenta and yellow content in the proof image. Alternatively, the technician could visually examine the reds in the proof image. If the reds appear too orange, the colorants could be appropriately changed to decrease the yellow content of the proof image or alternatively increase its magenta content. In that regard, it is widely known that an average human vision is acutely sensitive to flesh tones (which specifically contain red hues). Hence, even a subtle difference in coloration may be perceived as transforming an otherwise pleasant image of a human face into one that is quite unnatural and obnoxious. Through such approaches, even a skilled color technician may still need to generate upwards of 12-15 separate proof images in seriatim, typically requiring a full day of work, until he discerns the proper operating condition of the proofing system which is needed to achieve an acceptable color match between the target image and a proof image therefor and thereby calibrate the proofing system to the target imaging system in use.

Through a totally different approach, the technician could quantitatively measure reflection densities of selected portions of the image on both the target image and the proof image using, for example, a reflection densitometer, and then attempt to set the colorants in a manner that seeks to achieve the densities inherent in the target image. Unfortunately, this approach is constrained by the ability of the technician to locate corresponding relatively large uniformly colored areas on both the target image and the proof image at which the reflection densitometer can be reliably placed to take measurements. If both images contain significant detail, then suitable measurement areas may not exist and thereby preclude such densitometric measurements from being made. Moreover, as densitometers are designed specifically for measurement of amounts of colorants in an image and not for measurement of colors as perceived by humans, a densitometric match between the target and proof images will often be visually objectionable. For example, if the yellow colorant in the target image absorbed blue light over a wide band of wavelengths and the yellow colorant in the proof image absorbed blue light over a narrow band of wavelengths, a wide band densitometric match would lead to a proof image with a perceived excess of yellow colorant.

Apart from a reflection densitometer, one device that has recently become available for color measurement and matching is a spectrophotometer, such as the Model SPM 50 spectrophotometer manufactured by Gretag Corporation of Regensdorf, Switzerland. This device projects white light of a known spectral distribution onto an image, then separates the spectrum of reflected light from the image through a diffraction grating and thereafter measures the intensity of the reflected radiation at a number of different wavelengths. Through this device and its associated software, colorimetric spectral based measurements can be made of any reflection image. A commercially available software package (i.e. the "CMYK Conversion System" software) for use with this device and available from Gretag determines proper halftone dot size in the separations in order to achieve a desired coloration in the reflection image made therefrom. This software conceivably could be used to characterize (i.e. "model") a proofing system in use and then effectuate a color balance between a press sheet and a proof therefor. Specifically, a set of known test (reference or calibration) separations having numerous, complex and atypical patterns is provided with the device and software; the latter storing dot area settings for these separations. To characterize the proofing system, a proof image would be made from the reference separations. Thereafter, spectrophotometric measurements could be taken of this particular proof image. The resulting measurements, when processed, would yield a model that characterizes the color gamut producible through the proofing system. Thereafter, in order to generate a color match to a target image, the device could then be used to take spectrophotometric measurements of the target image. Given the characterization of the proofing system and the latter set of measurements, the software will determine appropriate values to use for solid area densities and corresponding halftone dot sizes for each primary colorant in the proofing system in order to generate a proof image that should match the target image for any particular color.

Inasmuch as the color gamut reproducible through a proofing system does not coincide with that appearing in the target image, the software used with this device, if used to match several colors simultaneously, is constrained, just as the technician is in manually performing a color match, to effectuate a compromise in matching the two gamuts between the target image and the proof image therefor. In achieving a color match, this software relies on the well-known CIELAB (L*a*b*) color coordinate system and color differences associated therewith. In computing a multiple color match, the software seeks to minimize an overall $\Delta E$ value (i.e. a root sum squared length of multiple CIELAB color differences) between the two color gamuts and thus obtain an overall "colorimetric" match.

Even though the CIELAB system was designed to provide a nearly balanced measure of noticeable color differences, a relatively large colorimetric difference for some colors will lead to a relatively small $\Delta E$ value; while this will not be true for other colors. Any system, such as the Gretag spectrophotometer, associated test separations and software, that seeks to minimize an overall colorimetric error between two images produced by systems with differing tone and color reproduction characteristics may well still produce minor color mismatches (as judged by their $\Delta E$ values) for some colors that, in various image contexts, would be highly objectionable to a human observer.

In particular, it has been known for some time that human color perception, including mental judgment, exhibits differing sensitivities for different colors. Given this, human observers will be much more acutely aware of what would amount to minor color differences, such as differences in so-called "memory" colors (e.g., greens and flesh tones), in certain pictorial contexts than in others. Accordingly, a color difference that would simply be noticeable, if at all, in some contexts would be highly objectionable in others. For example, people are acutely aware of very small differences in flesh tones. A viewer will likely object to a human face that appears too blue or green, while merely noticing, if at all, and certainly not objecting to a tablecloth or blanket that exhibited the same variation. Thus, an effective color balance needs to account for the preferences inherent in human color perception. Specifically, if a target image is compared side-by-side to an accurate proof image thereof, a viewer should reach the conclusion that the proof image in effect has a good appearance, i.e. flesh tones appear as they should as well as do other colors given the context of the image thereon. In this instance, the relative coloration throughout the proof image is pleasing even though the specific hues in the proof image will not necessarily identically match those in the target image. Such a visually pleasing match between a proof image and a target image will hereinafter be referred to as an "appearance match".

Any system, such as the Gretag spectrophotometer and associated test separations and software, that attempts to provide a uniform "colorimetric" match across all colors using a metric based on context independent noticeability ignores the innate preferences inherent in human color perception. Consequently, the resulting proof image, based solely on such a colorimetric match to the target image, is likely to contain minor color differences, that depending upon the context of the particular image, can be highly objectionable to a viewer. Consequently, the proof image would not be a visually appealing representation of the target image. In these instances, an overall balance colorimetric based approach to color matching will clearly yield an unsatisfactory match that simply can not be used to calibrate a proofing system. When this occurs, a color technician would likely revert back to a manual approach to locate what he subjectively perceives to be an appearance match between the target image and the proof image— but will be forced to accept a rather high cost in time and material to do so.

As one can now appreciate, thus far the art has simply failed to provide a relatively fast systematic technique for objectively and automatically achieving a satisfactory appearance match between one color image, such as a press sheet, and another image, such as a proof therefor, for nearly all images, and particularly for use in calibrating one imaging system, such as a proofing system, to a target imaging system, such as a press.

Furthermore, proof images are typically printed, particularly through the proofing system described in the '459 Cowan et al patent, with so-called "run bars" that appear alongside the proof image. Each run bar provides a pre-defined sequence of color test patches composed of various combinations of primary colors, both as solids and halftones, as well as other diagnostic targets. These bars are intended to provide test areas for taking densitometric measurements of areas of uniform colors. For example, a typical run bar will contain, among others, separate solid and halftone color patches for the K, C, M and Y primary colors; separate solid color patches for the red (M and Y overprint), green (C and Y overprint), blue (C and M overprint) and three-color overprints (C, M and Y); and halftone color patches for a three-color overprint. Inasmuch as these bars exist alongside the proof and are formed by the proofing process using the same colorants as in the accompanying proof image itself, these bars identically represent the result of the proofing system tone and color reproduction characteristics in the proof image. Given the existence of the run bars in proof images, particularly those produced through the proofing system described in the '459 Cowan et al patent, it would be highly desirable to utilize these bars in some fashion to effectuate a color match between the proof image and a target image. Similar run bars are placed on target images, such as a press sheet. Alternatively, simple, easily generated and commonly used test objects such as step tablets comprising primary color, two color and three color overprint solids and tints could provide increased amounts of detail for specification of a tone reproduction curve shape, such as through the "Aim" dot gain capability of the DDCP system described in the '940 Spence application.

Therefore, a need currently exists in the art for a technique, specifically though not exclusively intended for inclusion in a proofing system, that can be used, particularly in conjunction with run bars or other simple test objects, to quickly, objectively and automatically provide an appearance match between an image produced by one imaging system, such as a proof image, and another image, such as a press sheet, produced from a common image source but by a different imaging system. While the colorations in such a match will rarely be identical due to differences in reproducible color gamut and color response between these two systems, the match attained through this technique should nevertheless result in, for example, a proof image that is, in substantially all instances, a visually accurate and appealing representation, i.e. an appearance match, of a target image. Moreover, by automatically providing an appearance match through objective criteria, such a technique should significantly reduce the trial-and-error effort and the degree of skill required of a user, as well as the associated time and cost, needed to achieve such a match and thereby calibrate a proofing system to a press or another proofing system.

DISCLOSURE OF THE INVENTION

Accordingly, an object of the present invention is to provide apparatus and associated methods, for use in illustratively a proofing system, that will objectively provide an appearance match between two images, such as a press sheet and a proof therefor.

A specific object is to provide such a match relatively quickly and automatically based on measurements, such as illustratively colorimetric, taken of both images.

Another specific object is to provide such a match in a manner that demands less skill and expertise of a user than has heretofore been required in the past.

Another specific object is to provide such a match in much less time and at significantly less cost than has heretofore been required in the past.

Another specific object is to provide such a match through use of run bars or other simple test objects, that appear on both images.

Another object is to provide a technique for calibrating one imaging system, such as the proofing system, to another, such as a press or another proofing system, based on the appearance match attained for two images associated therewith, such as, for example, between a press sheet and a proof therefor.

These and other objects are achieved in accordance with my inventive teachings by first obtaining data, such as illustratively CIELAB ($L^*a^*b^*$) colorimetric measurements, for the same portions of two corresponding depictions of a common image but produced by different first and second imaging systems (i.e. a target image produced by one imaging system, such as a press sheet generated by a printing press, which is to be matched by a replica image produced by another imaging system, such as a proof generated by a color halftone proofing system). This data is either obtained in or transformed into a color space which encodes color information in a pre-defined manner that approximates human color perception. Thereafter, through use of a pre-determined model of the second imaging system, incorporated into pre-defined matching principles which objectively and quantitatively define an accurate appearance match between images produced by both imaging systems, recommended operating settings (particularly changes therein) for the second imaging system, e.g. the proofing system, such as colorant solid area and tint densities, are determined which will calibrate the response of this system to that of the first imaging system, e.g. the press. Further, given densitometric data from the replica image, changes in operating settings can be combined with the effect of the current settings, as measured, to provide absolute rather than relative operating setting recommendations. Through this methodology, tone and color renditions produced by the second imaging system are modified to provide an accurate appearance match of those obtained from a common image source on the first imaging system, given the judgmental preferences of a human observer and the performance limitations of the second imaging system. For example, the operational settings of a proofing system would be altered in a manner which will produce a proof image that is an accurate appearance match to the target image produced by a printing press or alternate proofing system.

To obtain a proper set of operational settings in relatively short time, the model and matching principles are combined to yield feedback-based equations which, if necessary, can be iteratively processed with measurement data from each of a succession of proof images. In this manner, operating settings are determined for an initial proof image and a target image; the operating condition of the second system, i.e. the proofing system, is then set in accordance with these settings; and a new proof image is generated. This process is then repeated, if needed, with a new operational settings being produced and used to subsequently set the proofing system, and so on, until the operational settings appropriately converge, such as within-pre-defined convergence limits, at which point the proof does appear to a user to be an accurate "appearance match" to the target image.

In accordance with a preferred embodiment of my present invention, specifically one directed to use with a sublimation dye transfer direct digital color proofing (DDCP) system, my inventive technique relies on first obtaining measurements, typically well known CIE-LAB (L*a*b*)=colorimetric measurements, of corresponding test patches of the same image but printed on a target image and on a halftone proof therefor. Thereafter, using predefined matching principles as well as a process color model (based upon illustratively sensitivity coefficients of locally linearized empirical performance data) of the performance of the proofing system, incremental changes in the operating conditions (specifically changes in solid area densities for the process color solids and halftone dot sizes for process color tints) are determined which, when fed back to the proofing system, effectuate an appearance match between the proof and a corresponding target image. As such, the proofing system will be calibrated to the performance of target imaging system and thus will accurately predict on an "appearance match basis" the subsequent response of the target imaging system, at its current operating conditions, to different images subsequently provided, through halftone separations, to both the proofing system and the target imaging system.

Advantageously, the inventive technique automatically and objectively provides an accurate appearance match between two images and therethrough calibrates one imaging system, such as a proofer, to another, such as a printing press, in a manner that is significantly faster and less expensive, and requires substantially less user expertise than both trial-and-error methods, that have heretofore found use in the art, and overall colorimetric match based methods.

BRIEF DESCRIPTION OF THE DRAWINGS

The teachings of the present invention may be readily understood by considering the following detailed description in conjunction with the accompanying drawings, in which:

FIG. 9 depicts a flowchart of Proof Image Data Entry routine 900 that is also executed within Color Calibration Manager Main routine 700 shown in FIG. 7;

FIG. 12 depicts a flowchart of Color Calibration File Manager routine 1200 that is also executed within Color Calibration Manager Main routine 700 shown in FIG. 7;

To facilitate understanding, identical reference numerals have been used, where possible, to denote identical elements that are common to various figures.

MODES OF CARRYING OUT THE INVENTION

After reading the following description, those skilled in the art will readily appreciate that my present invention can be used in a wide variety of different imaging systems to objectively provide an appearance match between a depiction of an image produced by one such system (i.e. a "target" image) to a depiction of the same image but produced by a different imaging system (i.e. a "replica" of the target image) and thereby calibrate the latter system to the former. In general, differing imaging systems, as well as the media which depict these images, have differing tone and color reproduction (color gamut and response) characteristics. As such, the coloration of the replica image will rarely match that of the target image throughout the entire color space of either image. For example, flesh tones, which are predominantly red hues, depicted in one image medium, such a transparency, may not appear to have the same color on another image medium, such as a halftone color image that is printed on a page, while other colors will match. However, since my inventive technique provides a color match that is sensitive to the manner through which colors are perceived and differences in colors are judged by human observers, the replica image will be a visually pleasing, though not necessarily identical, depiction of the appearance of the target image. With this in mind and to simplify the following discussion, my invention will now be discussed in the context of use in halftone color printing apparatus, having a halftone proofing system and a target imaging system (the "target system"), for generating a halftone color proof (here being a so-called "replica" image) that has an appearance match to a target image generated by the target system and for calibrating the proofing system (also referred to herein as a "proofer") to the target system.

A. Overall Halftone Color Printing Apparatus

Figure 1:
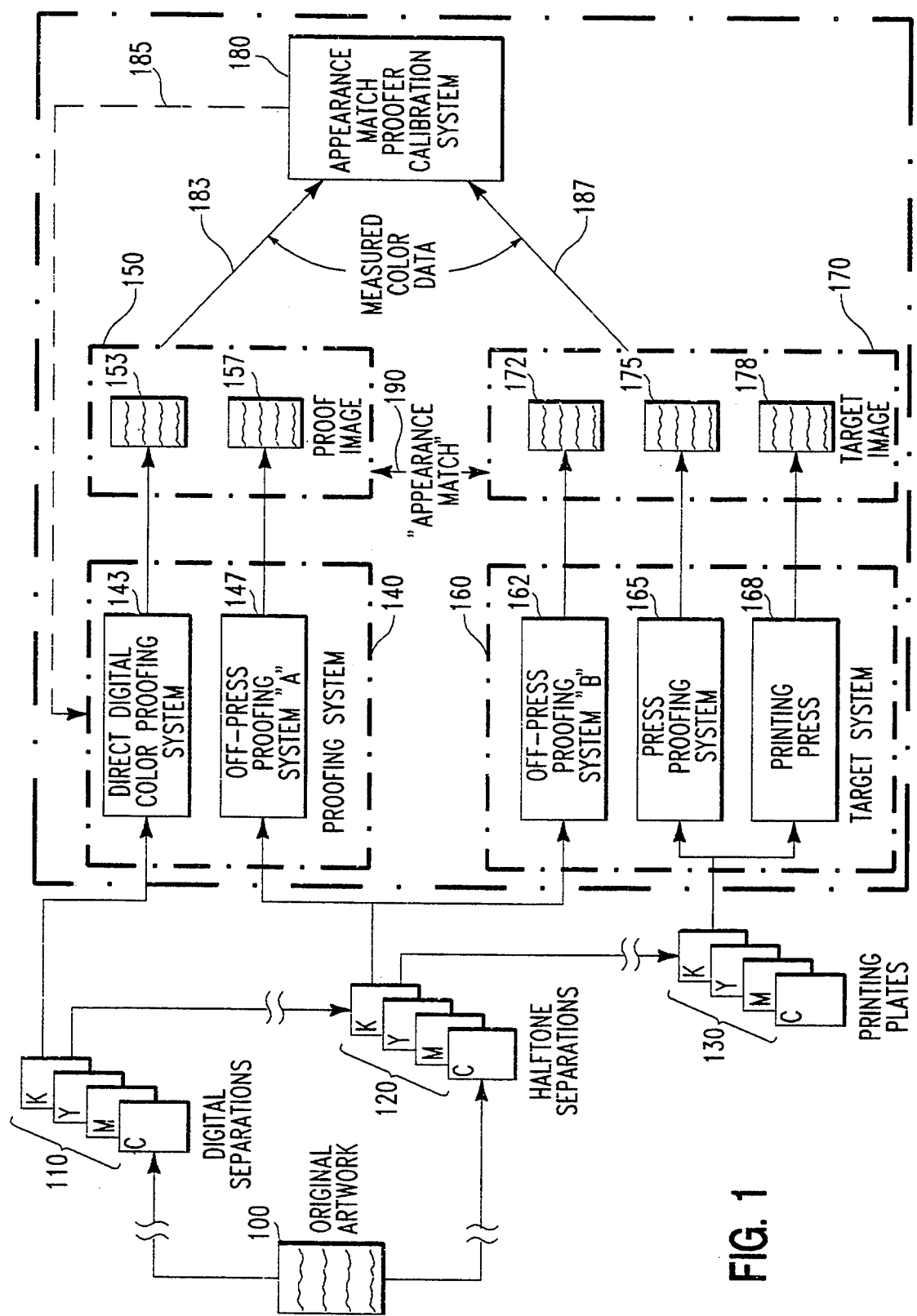
FIG. 1 is a high level block diagram of halftone color printing apparatus 5 that incorporates my present invention.

FIG. 1 shows a high level block diagram of halftone color printing apparatus 5 that incorporates my present invention. As conventionally used in the printing trade, system 5 contains proofing system 140 and target system 160. Proofing system 140 comprises either direct digital color proofing (DDCP) system 143 or off-press proofing system "A" (also denoted by reference numeral 147). =Target system 160 comprises either off-press proofing system "B" (also denoted by reference numeral 162), press proofing system 165 or printing press 168. Proof image 150, comprising either direct digital color proof 153 produced by DDCP system 143 or off-press color proof 157 produced by off-press proofing system ("A") 147, obtained from proofing system 140 is intended to be predictive of target image 150. This latter image comprises either off-press proof 172 produced by off-press proofing system ("B") 162, press proof 175 produced by press proofing system 165 or press sheet 178 produced by printing press 168. In order to render a halftone color image of continuous tone ("contone") original artwork 100, e.g., a color transparency, through apparatus 5, a set of digital separations 110 may be made for this artwork, through processes not shown or relevant here. A set of (screened) halftone separations 120 is also made for this artwork, through processes not shown or relevant here, either from digital separations 110 or directly from the original artwork 100. Either set 110 or 120 typically contains a separate separation for each subtractive primary color: cyan (C), yellow (Y), magenta (M) and black (K). The set of digital separations 110, when produced, is either directly used within DDCP system 143 to form direct digital color proof 153 or used to produce the set of separations 120. The set of separations 120 is either directly used within off-press proofing system 147 to form off-press proof 157, off-press proofing system 162 to form off-press proof 172 or is subsequently formed, through other processes not shown or relevant here, into a set of printing plates 130 which, in turn, is used within either press proofing system 165 to form press proof 175 or printing press 168 to print multiple reproductions of the halftone color image on, for example, publication stock.

In an effort to significantly reduce, inter alia, the time, tedium and expense associated with generating an acceptable halftone reproduction of original artwork 100 on target system 160, proofing system 140 is utilized to generate color halftone proof 150. This proof is intended to provide an accurate and predictive representation of target image 170, which would be produced by target system 160. Undesirable image artifacts or color differences that would otherwise appear on the target image should first appear in the proof. Through judicious changes made, typically on an iterative basis, to one or more of the halftone separations, a color technician is expected to be able to entirely eliminate these artifacts and differences or at least render them sufficiently invisible to a human observer prior to undertaking the time and expense associated with further steps, e.g., producing a set of printing plates 130 from separations 120 for use in printing press 168.

My invention is particularly (though certainly not exclusively) applicable to use in a proofing system with variable tone reproduction characteristics, such as the =optical electro-photographic proofing system described in U.S. Pat. No. 4,708,459 (issued to C. Cowan et al on Nov. 24, 1987, assigned to the present assignee hereof and hereinafter referred to as the '459 Cowan et al patent) which is incorporated by reference herein or the DDCP system described in U.S. patent application No. 07/782,940 (filed by J. Spence on Oct. 25, 1991, also assigned to the present assignee hereof and hereinafter referred to as the '940 Spence application) and which is also incorporated by reference herein. For purposes of simplicity, my invention will be discussed in the context of use of the DDCP system to provide proofs for press sheets. I will also note illustrative differences that may arise when my invention is used in connection with an optical electro-photographic proofing system. By way of background, in DDCP systems, each digital separation carries the color information for only one of the primary colors. Correspondingly, in an optical proofing system, each halftone separation is essentially a negative (or positive) transparency with an altered tone reproducing characteristic that carries the color information for only one of the primary colors. Of course, my invention can easily be used in connection with a wide variety of other imaging systems.

In any event, to sufficiently reduce the effort and expense associated with generating acceptable printed halftone reproductions of a color image, halftone proof 150 should accurately predict how an image captured on digital separations 110 would appear on press sheet 178. In this regard, the response of DDCP system 143 shown on proof 153 to a set of separations must accurately reflect the response of printing press 168 shown on press sheet 178 to the same set of separations.

Inasmuch as the imaging process used by system 143 for producing halftone images formed on a dye transfer receiver and subsequently transferred to paper (the paper having characteristics similar to the paper which will be used in a press) differs, in this case significantly, from that used by press 168 to produce an image on publication stock, DDCP system 143 and press 168 will reproduce colors within different color gamuts as well as possess different color responses. Accordingly, the tone and color reproduction characteristics of proof image 153 will not coincide with those of the image on press sheet 178. As such, an area in a given set of separations 110 derived, for example, from a particular red hue in an artwork 100, when applied to both proofing system 143 and (after several intermediate steps) press 168, will likely produce different red hues in a proof and a press sheet.

In view of the inherent tone and color differences between the press sheet and the resulting proof thereof, the colors in the press sheet can not be identically matched by those that will appear in the proof. Nevertheless, for a proofing system to fully serve its intended purpose and be accurately predictive of a press, the tone and color reproduction characteristics of the proofing system must be calibrated, to the extent possible, to those of the press. Once calibrated, the proofing system should be able to accurately predict the performance of the press though, in most situations, it will generate a proof image with colors that do not exactly match those in the press sheet.

Traditionally, a color technician performed this calibration by manually comparing a press sheet and a proof image therefor, on a side-by-side, basis to determine how to effectuate a proper "appearance" match between these images. Such a match, while not exact in color rendition, would result in a proof that was visually pleasing (i.e. had a "good appearance") and which accounted, to the extent possible, for human color perception. Unfortunately, finding an appearance match between two images often required an inordinate amount of time and a very high level of skill. First, the technician was required not only to critically judge color differences between proof 153 and press sheet 178 but also to fully appreciate the performance inter-relationships between the colors that appeared on the proof and the corresponding ones that would appear on the press sheet. Second and equally important, the technician was also required not only to decide, based upon the specific image content, which particular colors to match but also to determine what the proper variations in the tonal reproduction characteristics of proofing system 143 would be in order to achieve an acceptable match between the proof and the press sheet and then set the operating characteristics (e.g. solid area density and halftone dot sizes for each process color) of the proofing system accordingly.

Inasmuch as proofing system 143 generally provided an extremely large number of different possible combinations of solid area density and halftone dot sizes across all the process colors, an experienced color technician often needed to run successive proofs and iteratively change the settings until he found a particular combination that yielded an acceptable appearance match between the proof and the press sheet. While in most cases, the technician was able to iteratively converge on a suitable combination through directed trial-and-error experimentation, in some cases, the technician was simply forced, based upon the context of the image and the colors used therein, to resort to mere guesswork. Furthermore, with certain images, the technician simply had insufficient skill to quickly determine the proper operating conditions of the proofing system, and owing to time constraints, was forced to settle for a color match that was not the best possible but rather was merely acceptable. Not surprisingly, over the years, empirical procedures have been developed for use by the technician to reduce the time required to locate a proper color match. However, even with these procedures, a skilled color technician still required upwards of 12-15 proofs, ordinarily a full day of work, to determine the proper calibration settings needed to achieve an acceptable color match between the proof and a press sheet therefor and thereby calibrate proofing system 143 to press 168. Moreover, other techniques, such as those which would rely on spectrophotometric comparisons and matching through use of the well known CIELAB color difference standards, would tend to yield compromise overall colorimetric matches that, in many instances, were very poor appearance matches.

Hence, in accordance with the teachings of my invention, I have devised a technique for objectively, automatically and quickly determining a highly acceptable appearance match between two depictions of the same image but produced through two different imaging systems, such as between proof 153 and press sheet 178, and, based upon such a match, calibrating one of these systems to the other, e.g. calibrating DDCP system 143 to press 168. Through use of my technique, the proof image will accurately represent though not identically match but nevertheless be a very useful as well as a visually pleasing depiction of the press sheet.

In general, this technique relies on incorporating my inventive appearance match proofer calibration system 180 into printing apparatus 5. System 180 obtains measurements, typically well known CIELAB (L*a*b*) measurements as symbolized by lines 183 and 187, of corresponding test patches of the same image but printed on, for example, a halftone proof and on a press sheet therefor. These measurements approximate the response of human color perception. Thereafter, using pre-defined matching principles as well as a process color model (based upon illustratively sensitivity coefficients) of the performance of proofing system 143, system 180 determines recommended incremental changes in the operating conditions (specifically solid area densities for the process color solids and halftone dot sizes for process color tints) which, when fed back (as symbolized by dashed line 185) to proofing system 143, effectuate an appearance match, as symbolized by dashed line 190, between proof 153 and press sheet 178. As such, proofing system 143, with its operating conditions so changed, will be calibrated to the performance of press 168 and thus will accurately predict on an "appearance match basis" the subsequent response of the press, at its current operating conditions, to different images subsequently provided on separations 110.

B. Objective Color Representations

Figure 4:
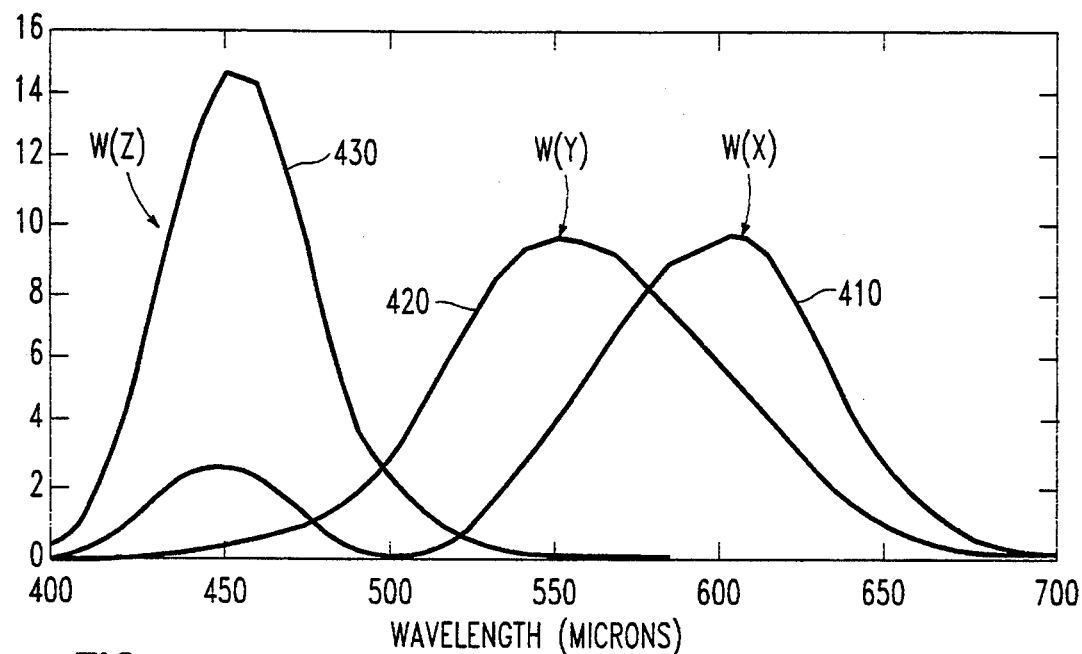
FIG. 4 is a graphical depiction of tristimulus spectral weights used to define (X, Y, Z) tristimulus values.

The human visual system is essentially a three-channel light processor which converts light absorbed by three dyes located in cone cells in the retina of the eye into signals in opponent dimensions of white-black, red-green and yellow-blue. Color attributes (such as lightness, hue and saturation or purity) are commonly described through use of tristimulus values (X,Y,Z). Tristimulus values are computed from spectral data using weights empirically derived from color matching experiments. Procedures for deriving tristimulus values were first adopted as a basis for color description by the International Commission on Lighting (Commission Internationale de l'Éclairage or CIE) in 1931. The spectral weights (W(X), W(Y), W(Z)) for a CIE standard colorimetric observer (2° field size) for use with illuminant D50 (approximately 5000° K. tungsten) are shown as curves 410, 420 and 430 in FIG. 4. Tristimulus value Y correlates with perception of lightness-darkness; tristimulus value Z correlates with perception of yellowness-blueness. However, there is no direct color correlate with tristimulus value X. Over the years, a large number of transformations of tristimulus values have been proposed in the art for one use or another. Unfortunately, all of these transformations provided a rather distorted view of color distance and color differences. In 1976, CIE adopted two color spaces that are derived from tristimulus values and in whose coordinate systems ordinary distance measures can be used to measure color differences. Specifically, the so-called CIELUV color space is commonly used in describing colors from additive color systems, such as color television. The so-called CIELAB color space is commonly used in subtractive color systems, such as offset printing. For a detailed description of these and other color spaces, see, e.g., R. W. G. Hunt, *Measuring Colour* (© 1987: John Wiley and Sons, New York). The CIELAB color space has as its three dimensions L* which is achromatic, and a* and b*, which are both chromatic. In particular, CIELAB coordinates are computed from tristimulus values through equations (1) as follows:

$$L^* = 116\left(\sqrt[3]{\frac{Y}{Y_n}}\right) - 16$$

$$a^* = 500\left(\sqrt[3]{\frac{X}{X_n}} - \sqrt[3]{\frac{Y}{Y_n}}\right) \quad (1)$$

$$b^* = 200\left(\sqrt[3]{\frac{Y}{Y_n}} - \sqrt[3]{\frac{Z}{Z_n}}\right)$$

where:
L* represents an intensity measure in an image, i.e. the perceived "lightness" or "darkness";
a* represents a red-green color direction, positive values associated with red and negative values with green;
b* represents a yellow-blue color direction, with positive values for yellow and negative values for blue;
(X, Y, Z) are tristimulus values in an image; and
($X_n$, $Y_n$, $Z_n$) are tristimulus values for a reference white under the same illuminant as that which the image is being illuminated.

As such, through the transformation embodied in equations (1), tristimulus values are mapped into a single a*b* color plane with lightness L* as the third dimension. Note also that tristimulus ratios can be simply expressed in terms of L*, a* and b* by inverting this equation. In the CIELAB coordinate system, neutral colors (white, black and grays) have a* and b* coordinates of zero, with reference white having an L* coordinate of 100 and a completely absorbing black having an L* coordinate of zero. A derived polar coordinate system, CIELCH, uses chroma $$C = \sqrt{(a^*)^2 + (b^*)^2},$$

distance from the neutral axis, and hue angle $$h = \tan^{-1}\left(\frac{b^*}{a^*}\right),$$

in degrees measured from the positive a* axis, to describe color information.

CIELAB coordinates of a color in an reflection image can be measured by use of a spectrophotometer, which measures reflectances at various wavelengths. Spectral reflectance data is then converted to tristimulus values by forming a weighted linear transformation of spectral reflectance data using tristimulus weights for a particular observer and illuminant such as those shown in FIG. 4. The resulting tristimulus values, together with tristimulus values for a reference white, are then converted to CIELAB coordinates using equations (1). So-called absolute L*a*b* values are obtained by using reference white values corresponding to a perfect diffuser illuminated by the chosen illuminant. Paper reference L*a*b* values are obtained by using measured tristimulus values of paper as reference white values. Alternatively, a less expensive instrument, a filter colorimeter, which approximates the tristimulus computation by measuring reflectances through a set of filters, can be used to provide data for equations (1). Commercially available spectrophotometers and colorimeters typically are capable of automatically computing CIELAB coordinates. When only absolute CIELAB coordinates are provided by an instrument, equations (1) are easily inverted to provide tristimulus ratios both for any color and for paper. Upon forming ratios of these ratios, the absolute reference white tristimulus values cancel and equations (1) can be used to compute paper reference CIELAB coordinates.

Figure 5:
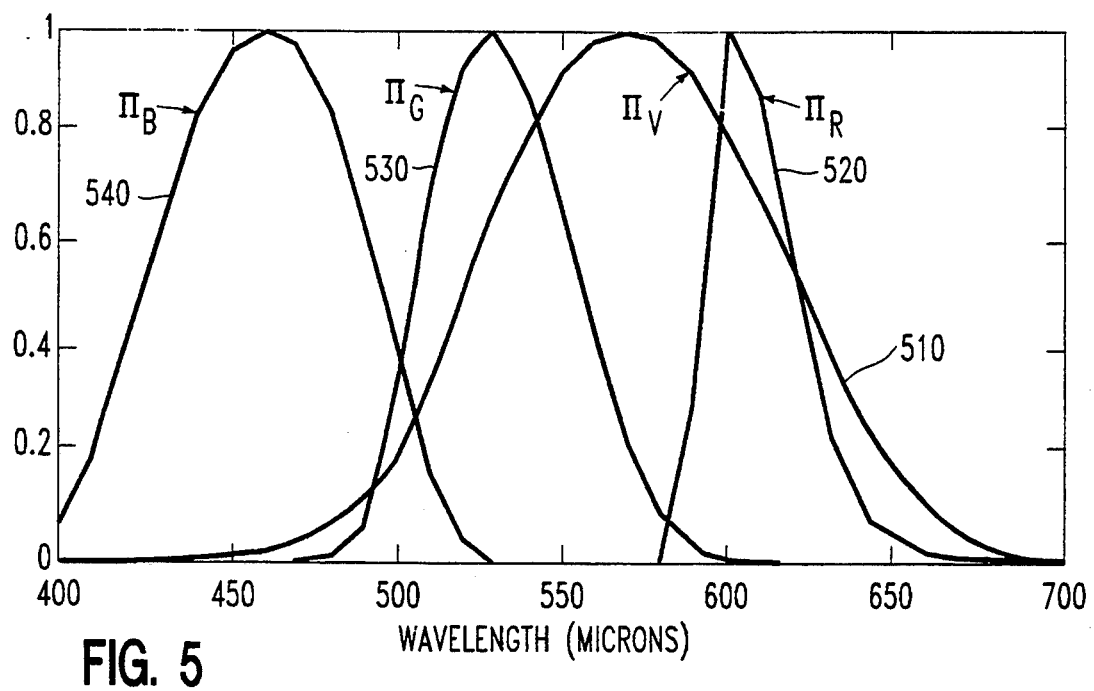
FIG. 5 is a graphical depiction of normalized spectral products used to define visual, red, green and blue "Status T" densitometric values.
Figure 6:
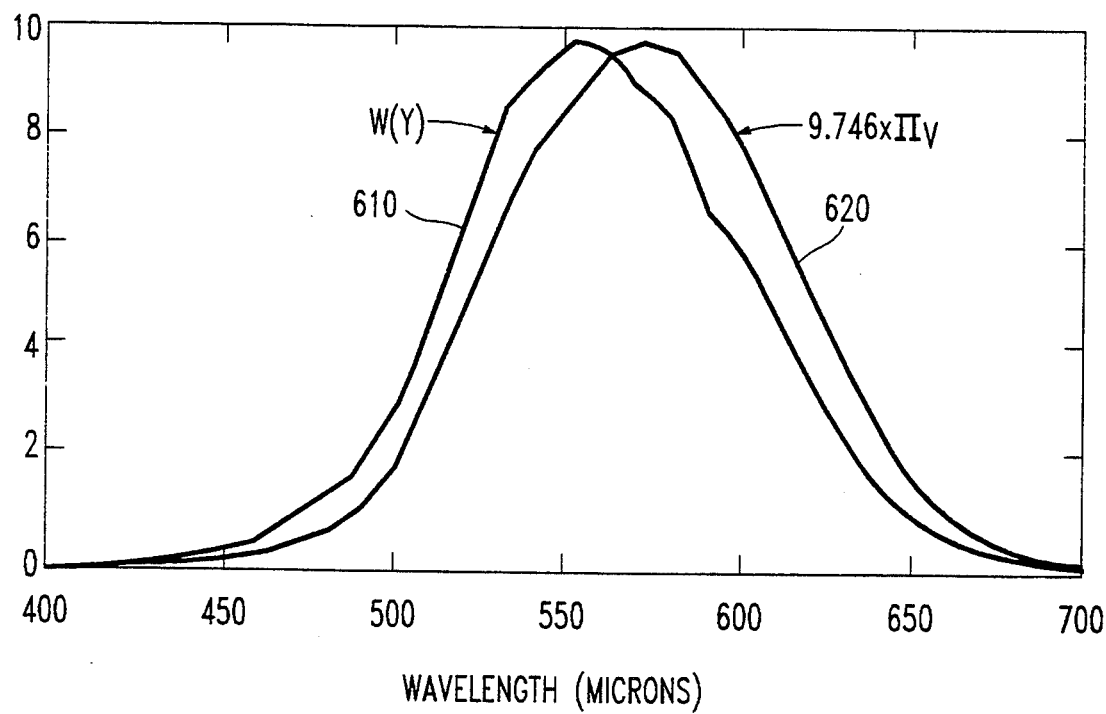
FIG. 6 is a graphical depiction of tristimulus spectral weights for Y and scaled visual channel spectral products for visual density.

Although I have found that my invention can provide excellent results through use of absolute CIELAB coordinates as measured by a colorimeter, this invention can be used with a wide variety of other color spaces and other input sources, provided proper attendant matching principles and process models are used. However, some care must be exercised when using instruments such as densitometers as color measurement tools. Densitometers, which are typically much less expensive than colorimeters or spectrophotometers, are intended to measure relative amounts of primary process colorants and typically do not use an illuminant and filter set combination which is equivalent to tristimulus spectral weights. For example, "Status T" densitometry uses spectral products (a normalized wavelength by wavelength product of illuminant intensity and filter transmittance) as shown as curves 510, 520, 530 and 540 in FIG. 5 to produce visual (V), red (R), green (G) and blue (B) density measurements respectively. Densitometers are intended to respectively measure amounts of black (K), cyan (C), magenta (M) and yellow (Y) colorants in a reflection image. Clearly, no combination of curves 520, 530 and 540 can reconstruct the weights for X (curve 410) or Y (curve 420). Furthermore, a mismatch would be large as well if curves 520, 530 and 540 were to be used to reconstruct the weights for Z (curve 430). It is possible to use curve 510 to reconstruct the tristimulus weights fairly well for Y (curve 420), with an equal peak value curve match shown as curves 610 and 620 in FIG. 6. However, even with all four densitometric spectral product curves, significant reconstruction errors can occur in certain portions of the spectrum. If one is making comparison only among colors formed from a related set of colorants, densitometric data may be convertible to colorimetric data. However, colors which have identical tristimulus values can have large spectral differences when formed by different colorant sets. If these spectral differences coincide with locations in the spectrum for which tristimulus reconstruction by the densitometer filter set is poor, such a pair of colors would be judged to be different by densitometric means. As such, use of densitometry as a data source can provide inferior results. Color judgments across colorant sets is precisely the capability my invention provides and that which advantageously permits my invention to yield an accurate appearance match.

C. Matching Principles

I have determined that, while the color gamuts and color responses reproducible through the press sheet and proof are different, an accurate appearance match between the press sheet and the proof can be obtained by matching several distinct items in both images.

First, for the C, M and Y solid process colors, I separately match: (1) the lightness (L*) coordinate for the three-color solid overprint test patches in both the press sheet and the proof, and (2) the hue angle (governed by the a* and b* coordinates) of the solid red test patches and the hue angle of the solid green test patches in both the press sheet and the proof. Through use of an L* coordinate match in the near neutral three-color overprint patch, the overall contrast in the press sheet is preserved in the proof: shadows appear dark and highlights appear bright. In addition, hue angle matching in the color plane assures red and green appearance color matching which results in proper appearance matches for many colors for which very minor differences are nevertheless acutely objectionable to human observers, i.e. the so-called "memory" colors. The red test patch is formed as a two-color overprint of magenta and yellow; the green test patch is formed as a two-color overprint of cyan and yellow. As such, reds and greens in the proof have the same hue, though not necessarily the same chroma, as in the press sheet. By securing such a match for solid reds and greens as well as a match in overall intensity, the proof will possess correct contrast and a proper range of color rendition.

Second, all three L*a*b* coordinates of the three-color tint overprints, at a plurality of dot sizes up to near the solid, in the press sheet and the proof are also matched. Matching these items provides a match in tint lightness and in lack of neutrality in the near neutral three-color overprint tone scale.

Third, since black is often used as a separate process color (in view of general use of non-balanced C, M and Y process inks as well as cost considerations), for gray replacement and to accentuate shadows and text thereby providing an extended color gamut, an achromatic (L* coordinate) match is also made at a plurality of dot sizes, between the proof and the press sheet, for solid black and black tints.

While color matching using these criteria will clearly not yield a proof that is a colorimetric match to a press sheet but rather a proof that is clearly skewed towards accurate red and green color rendition, the image in the proof will, in view of the innate preferences in human color perception, provide an accurate appearance match to the image in the press sheet.

With the above in mind, I shall now discuss the mathematical equations that embody these principles. These equations are presented in feedback form. The equations signify raw or transformed densitometric data by the notation $X_z{}^y$ wherein X is a particular pure colorant or overprint (either "K", "C", "M", "Y", "N", "R" or "G" for black, cyan, magenta, yellow, three-color, red and green, respectively), y is the data source (either "T" for target, here being the press sheet, or "P" for proof, i.e. the replica), and z signifying either a density channel ("v", "r", "g" or "b") or color space coordinate (L*, a* or b*) as appropriate. Corresponding recommended changes in an operating characteristic in the proof are indicated by $\Delta X_z$.

As noted above, solid C, M and Y process color matching entails L* coordinate matching for the three-color overprints and red and green hue angle matching for the M and Y overprint and the C and Y overprint. With the above notation in mind, three-color overprint L* coordinate matching is embodied in equation (2) below:

$$N_{L*}^T = (N_{L*}^P + \Delta N_{L*}) \tag{2}$$

Simply stated, the correction, $DN_L*$, needed in the three-color overprint achromatic coordinate is the difference between the values of the three-color overprint L* coordinate for the measured press sheet and proof.

Hue angle matching is given by equations (3) and (4) below:

$$R_{a*}^T \cdot (R_{b*}^P + \Delta R_{b*}) = R_{b*}^T \cdot (R_{a*}^P + \Delta R_{a*}) \tag{3}$$

$$G_{a*}^T \cdot (G_{b*}^P + \Delta G_{b*}) = G_{b*}^T \cdot (G_{a*}^P + \Delta G_{a*}) \tag{4}$$

Figure 2:
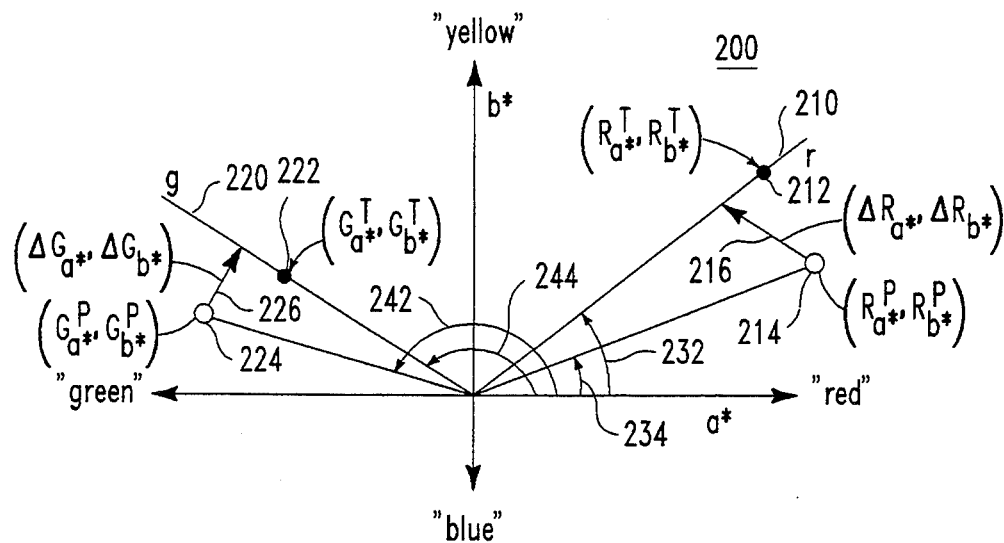
FIG. 2 is a graphical and conceptual depiction of the principle of two-color red and green a*b* color plane coordinate hue angle matching as used in my present invention.

To fully understand hue angle matching, consider FIG. 2 which graphically and conceptually depicts the principle of two-color red and green a*b* coordinate hue angle matching as used in my present invention. Within a*b* plane 200, the solid red and green colors for the press sheet (target), when plotted therein, appear as points 212, ($R_a{}^{T*}, R_b{}^{T*}$), and 222, ($G_a{}^{T*}, G_b{}^{T*}$), respectively. These points define, with respect to the positive a*-axis, corresponding lines 210 and 220 of constant hue angles 232 and 244, respectively. The specific red and green colors in the proof, when plotted in plane 200, are denoted by points 214, ($R_a{}^{P*}, R_b{}^{P*}$), and 224, ($G_a{}^{P*}, G_b{}^{P*}$), which lie on corresponding dashed lines emanating from the origin and define hue angles 234 and 242, respectively. In order to match the hue angles of the solid red and green a*b* coordinates between the press sheet (the target "T") and the proof, an amount of movement, ($\Delta R_a*, \Delta R_b*$) for the red solid and ($\Delta G_a*, \Delta G_b*$) for the green solid, is determined, through an equal ratio rule, which, when added to the proof solid red and green coordinates, will move these coordinates onto the red and green hue lines 210 and 220 for the press sheet and force the proof to exhibit solid red and green with respective hue angles 232 and 244. Equations (3) and (4) separately define the coordinate movements for the red and green solids.

As to the three-color tint overprints, a three-dimensional coordinate change ($DN_L*, DN_a*, DN_b*$) is determined which will simply match the proof to the press sheet. This matching principle is embodied in equations (5), (6) and (7) below:

$$N_L{}^{T*} = (N_L{}^{P*} + \Delta N_L*) \tag{5}$$

$$N_a{}^{T*} = (N_a{}^{P*} + \Delta N_a*) \tag{6}$$

$$N_b{}^{T*} = (N_b{}^{P*} + \Delta N_b*) \tag{7}$$

These equations are evaluated at each dot size of interest.

Now, as to the black solid and tint matches, a simple lightness, or L*, match is separately evaluated for each condition. This match is embodied in equation (8) as follows:

$$K_L{}^{T*} = (K_L{}^{P*} + \Delta K_L*) \tag{8}$$

D. Proofing System Model

To implement the matching principles embodied in equations (2)–(8), a model must be constructed of the proofing system, e.g., DDCP proofing system 143 (see FIG. 1). In order to provide a proper appearance match between a proof image 150, e.g., proof 153, and a target image 170, e.g., press sheet 178, by iteratively applying changes in operating settings, e.g., to DDCP system 143, provided by proofer calibration system 180 through use of measurements of the target image and successive sets of corresponding proof images, the proofing system is characterized in the form of a feedback model. Furthermore, the model expresses changes in responses, such as CIELAB coordinates, in terms of changes in process color (K, C, M and Y) densities for solids and for tints and specifically those changes which are needed in these densities to bring about the desired coloration changes in the proof.

With this in mind, the response of the proofing system can be modeled as given by equations (9)–(13) below, where in each of equations (9)–(12) S represents a matrix of pre-determined sensitivity coefficients:

(i) for the three-color solid overprints $$\Delta N_{L^*} = S_{NL^*} \begin{bmatrix} \Delta C_r \\ \Delta M_g \\ \Delta Y_b \end{bmatrix} \quad (9)$$

(ii) for the red and green solid colors $$\begin{bmatrix} \Delta R_{a^*} \\ \Delta R_{b^*} \end{bmatrix} = \begin{bmatrix} S_{Ra^*} \\ S_{Rb^*} \end{bmatrix} \begin{bmatrix} \Delta C_r \\ \Delta M_g \\ \Delta Y_b \end{bmatrix} \quad (10)$$

$$\begin{bmatrix} \Delta G_{a^*} \\ \Delta G_{b^*} \end{bmatrix} = \begin{bmatrix} S_{Ga^*} \\ S_{Gb^*} \end{bmatrix} \begin{bmatrix} \Delta C_r \\ \Delta M_g \\ \Delta Y_b \end{bmatrix} \quad (11)$$

(iii) for the three-color tint overprints $$\begin{bmatrix} \Delta N_{L^*} \\ \Delta N_{a^*} \\ \Delta N_{b^*} \end{bmatrix} = \begin{bmatrix} S_{NL^*} \\ S_{Na^*} \\ S_{Nb^*} \end{bmatrix} \begin{bmatrix} \Delta C_r \\ \Delta M_g \\ \Delta Y_b \end{bmatrix} \quad (12)$$

and (iv) for black solids and tints $$\Delta K_{L^*} = -(K^P_{L^*} + 16)(1 - 10^{-\Delta K_v/3}) \quad (13)$$

Equation (13) for black uses the near proportionality of the tristimulus weights for Y and the visual channel spectral product (see FIG. 6), equation (1) for L* and the relationship between reflectance and density to obtain a non-linear relationship which is easily computable for solids and tints. In essence, each of equations (9)–(12) characterizes the behavior of the proofing system as being locally linearized around a given operating point. The sensitivity coefficients are simply obtained through linear regression analysis of empirical measurements of the response of the proofing system to known changes in the operating point (i.e. given changes in C, M and Y solid area density and halftone dot size) within its color space. Actual illustrative values for the coefficients in the sensitivity matrices are provided in the associated pseudo-code below. I have determined that the values of the sensitivity coefficients are not extremely critical. Proper convergence, i.e. within predefined convergence limits, will still occur even if relatively inaccurate sensitivity coefficients are used, though the model may require one or more additional iterations (i.e. additional proofs) to achieve it. Furthermore, rather than using local linearization, more complex equations, such as a local quadratic fit in the CIELAB color space, could be used to hasten convergence in some instances, particularly when a relatively large change in primary colorant densities is required for the proof; though this will necessarily complicate the model, such as through the inclusion of both first and second derivatives thereto. In general, the sensitivity coefficients will likely be different for each different halftone dot coverage level—though this dependence is not explicitly shown in equation (12). Furthermore, the appropriate sensitivity coefficients may also change based upon variations in the solid area density levels used to implement these models, thus requiring different sets of sensitivity coefficients for correspondingly different solid area density levels.

E. Methodology for Determining Proofing System Calibration Settings

Given the matching principles for the three-color overprints and the proofing system model, appropriate portions of model equations (9)–(11) are substituted as the response changes ($DN_L^*$, $DR_a^*$, $DR_b^*$, $DG_a^*$ and $DG_b^*$) into equations (2)–(4) in order to express the matching principles directly in terms of the needed changes in the process color density values. The resulting set of linear equations is expressed in equation (14) as follows:

$$\begin{bmatrix} G^T_{b^*} \cdot S_{Ga^*} - G^T_{a^*} \cdot S_{Gb^*} \\ R^T_{b^*} \cdot S_{Ra^*} - R^T_{a^*} \cdot S_{Rb^*} \\ S_{NL^*} \end{bmatrix} \begin{bmatrix} \Delta C_r \\ \Delta M_g \\ \Delta Y_b \end{bmatrix} = \begin{bmatrix} G^T_{a^*} G^P_{b^*} - G^T_{b^*} G^P_{a^*} \\ R^T_{a^*} R^P_{b^*} - R^T_{b^*} R^P_{a^*} \\ N^T_{L^*} - N^P_{L^*} \end{bmatrix} \quad (14)$$

Similarly, for the three-color overprint tints, appropriate portions of model equation (12) are substituted as the response changes ($DN_L^*$, $DN_a^*$, $DN_b^*$) into equations (5)–(7) to yield the following set of equations (15) as follows:

$$\begin{bmatrix} S_{NL^*} \\ S_{Na^*} \\ S_{Nb^*} \end{bmatrix} \begin{bmatrix} \Delta C_r \\ \Delta M_g \\ \Delta Y_b \end{bmatrix} = \begin{bmatrix} N^T_{L^*} - N^P_{L^*} \\ N^T_{a^*} - N^P_{a^*} \\ N^T_{b^*} - N^P_{b^*} \end{bmatrix} \quad (15)$$

Finally, for the black solid area and tint densities, equation (13) is solved, using the response change $DK_L^*$ from equation (8), thereby resulting in equation (16) as follows for the changes in visual (v) channel density of black:

$$\Delta K_v = -3\log_{10}\left(\frac{K_{L*}^T + 16}{K_{L*}^P + 16}\right) \tag{16}$$

By relating the CIELAB coordinate differences for the process color overprints and solids between the proof and press sheet to changes in the process color densities, equations (14), (15) and (16) are used to yield an appropriate set of recommended changes in the process color densities in the proof in order to yield an appearance match between the proof and the press sheet.

In order to provide setting values for tint density in terms of halftone dot area, the units commonly used to define tone reproduction in the printing trade, the recommended tint density changes arising from solution of equations (15) and (16) can be converted to recommended dot area values by first adding the changes to corresponding process color density values obtained from the proof and then applying the well-known "Yule-Nielsen" dot area formula, as expressed in equation (17) as follows:

$$DA = 100 \frac{1 - 10^{(D_{min} - D_{tint})/n}}{1 - 10^{(D_{min} - D_{max})/n}} \tag{17}$$

where:
  $DA$ is dot area in percent;
  $D_{min}$ is the density of paper;
  $D_{max}$ is the density of the solid;
  $D_{tint}$ is the density of a tint; and
  $n$ is an optical gain adjustment factor.

Commonly, a value of $n=1$ is used, leading to effective reflectance, or "Murray-Davies", dot area, but a different value for n can be used provided it is applied consistently throughout. In cases where approximate dot area changes are desired, a linearization of equation (17), as given by equation (18) as follows, can be used:

$$\Delta DA = \frac{100 \ln 10}{n} \frac{10^{(D_{min}-D_{tint})/n}}{1 - 10^{(D_{min}-D_{max})/n}}\Delta D_{tint} = S_{area}\Delta D_{tint} \tag{18}$$

Although evaluation of the sensitivity coefficient Sarea in equation (18) involves paper base density ($D_{min}$) and measured tint and solid densities in the appropriate channel (V, R, G or B for K, C, M or Y, respectively), a useful approximation for commonly used solid densities and tint densities of a 50% input dot area is that Murray-Davies dot area changes (when expressed in percent) are approximately one hundred (100) times tint density changes, i.e., $S_{area}=100$. The approximate method embodied in equation (18) is particularly useful only when density data is not available, hence enabling dot area change recommendations to be made strictly from color data, or when merely dot area change recommendations are desired. In the electrophotographic proofing system context, dot area change recommendations at 50% input dot area, via equation (18), are used. By contrast, in the DDCP system context, dot area value recommendations, via equation (17), are used.

In order to utilize equations (14), (15), (16) and (17) to iteratively yield a set of recommended values, the following measurements are obtained for each press sheet and corresponding proof:

(i) for the press sheet ("target"):
CIELAB L*a*b* colorimetric data for
  (a) R, G and three-color overprint and K solids;
  (b) three-color and black tints; and
  (c) paper base;
(ii) for the proof ("replica"):
CIELAB L*a*b* colorimetric data for
  (a) R, G and three-color overprint and K solids;
  (b) corresponding three-color and black tints; and
  (c) paper base, and
"Status T" densitometric data for
  (a) C, M, Y and K solids;
  (b) corresponding C, M, Y and K tints; and
  (c) paper base.

Through use of equations (14), (15), (16) and (17), the following steps are utilized to form an appearance match between a press sheet and a proof:

A. Obtain the colorimetric data from a press sheet for the paper, three-color solids, the red and green solid (two-color) overprints, and at least one coverage level, such as a 50% halftone dot size, of three-color tints. In addition, obtain black scale data for the solids and tints from the press sheet.

B. Obtain corresponding colorimetric data to that obtained in step A from a test proof; and obtain densitometric data for paper and process color solid area and corresponding tints.

C. Formulate equation (14) and solve for the recommended changes in solid area densities for the process colors C, M and Y.

D. Formulate equation (15) and solve for the recommended changes in tint densities for the process colors C, M and Y; use density data from step B and equation (17) to convert tint density changes to dot area recommendations.

E. Solve equation (16) for the recommended changes in the solid and tint densities for black; use density data from step B and equation (17) to convert tint density changes to dot area recommendations.

F. Generate a proof using the recommended setting changes provided through steps B-E.

G. Repeat steps B-F until an acceptable appearance match results between the most recent proof and the press sheet.

F. Hardware

Figure 3:
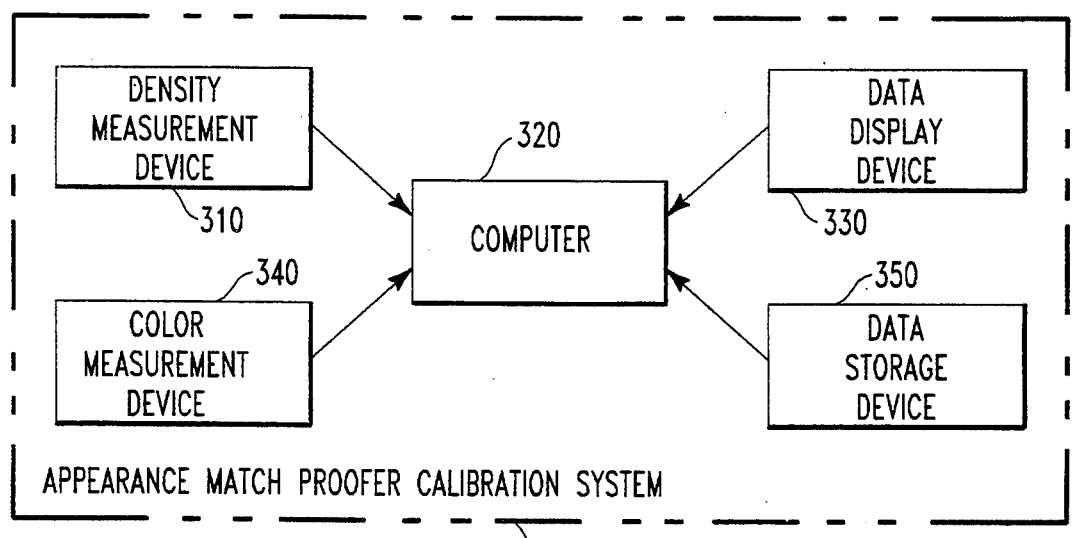
FIG. 3 depicts a block diagram of a preferred embodiment of my inventive Appearance Match Proofer Calibration System 180 shown in FIG. 1.

FIG. 3 depicts a block diagram of a preferred embodiment of my inventive Appearance Match Proofer Calibration System 180 shown in FIG. 1. As shown, system 180 is formed of density measurement device 310, computer 320, data display device 330, color measurement device 340 and data storage device 350. Density measurement device 310 is illustratively an "X-Rite" type 408 Densitometer. Color measurement device 340 is illustratively an "X-Rite" type 918 Colorimeter. Note that a single spectrophotometer may be used to perform both density and color measurements. Computer 320 can be any microprocessor based system, or even in very simple implementations a programmable scientific calculator such as a model HP48SX calculator manufactured by Hewlett Packard Company of Palo Alto, Calif. Data display device 340 is illustratively a video display terminal and attached dot matrix printer. Data storage device 350 is illustratively a hard disk drive incorporated within computer 320. Under program control of the computer, color measurement device 340 is manually and successively placed by a technician over each prescribed test patch on both the press sheet and the proof. For each patch, the color measurement device then produces an absolute CIELAB L*a*b* measurement thereof. This data, if desired, can be stored on data storage device 350. Also under program control of the computer, the density measurement device is then manually and successively placed by a technician over each prescribed test patch on the proof. For each patch, the density measurement device generates an associated V,R,G,B "Status T" densitometric measurement thereof. This data, if desired, can also be stored on data storage device 350. The measurement data are processed by computer 320, according to the methodology set forth above and the following flowcharts and pseudo-code, to generate recommended changes in and values of process color solid and tint densities. Once these changes and values are determined, the computer routes them to data display device 330 for operator inspection and optional hard-copy printout generation thereof. Additionally, recommended dot area values can be saved to data storage device 350 for subsequent use in a tone scale reproduction control system as described in the '940 Spence application. With these changes and values having been determined and displayed, the color technician then simply varies the settings on the proofing system by the specific amounts indicated to produce another proof, if warranted.

G. Software

I will now address the relevant software that can be used to implement my invention in a general purpose microcomputer system. By greatly simplifying the software through elimination of various features, such as database management and file editing, which are all unrelated to solving equations (14), (15), (16) and (17), the invention can be practiced by appropriately programming a simple hand-held scientific calculator. After discussing the flowcharts, I will present various pseudo-code routines that can be used for implementing solutions to equations (14), (15), (16) and (17).

1. Flowcharts

Figure 7:
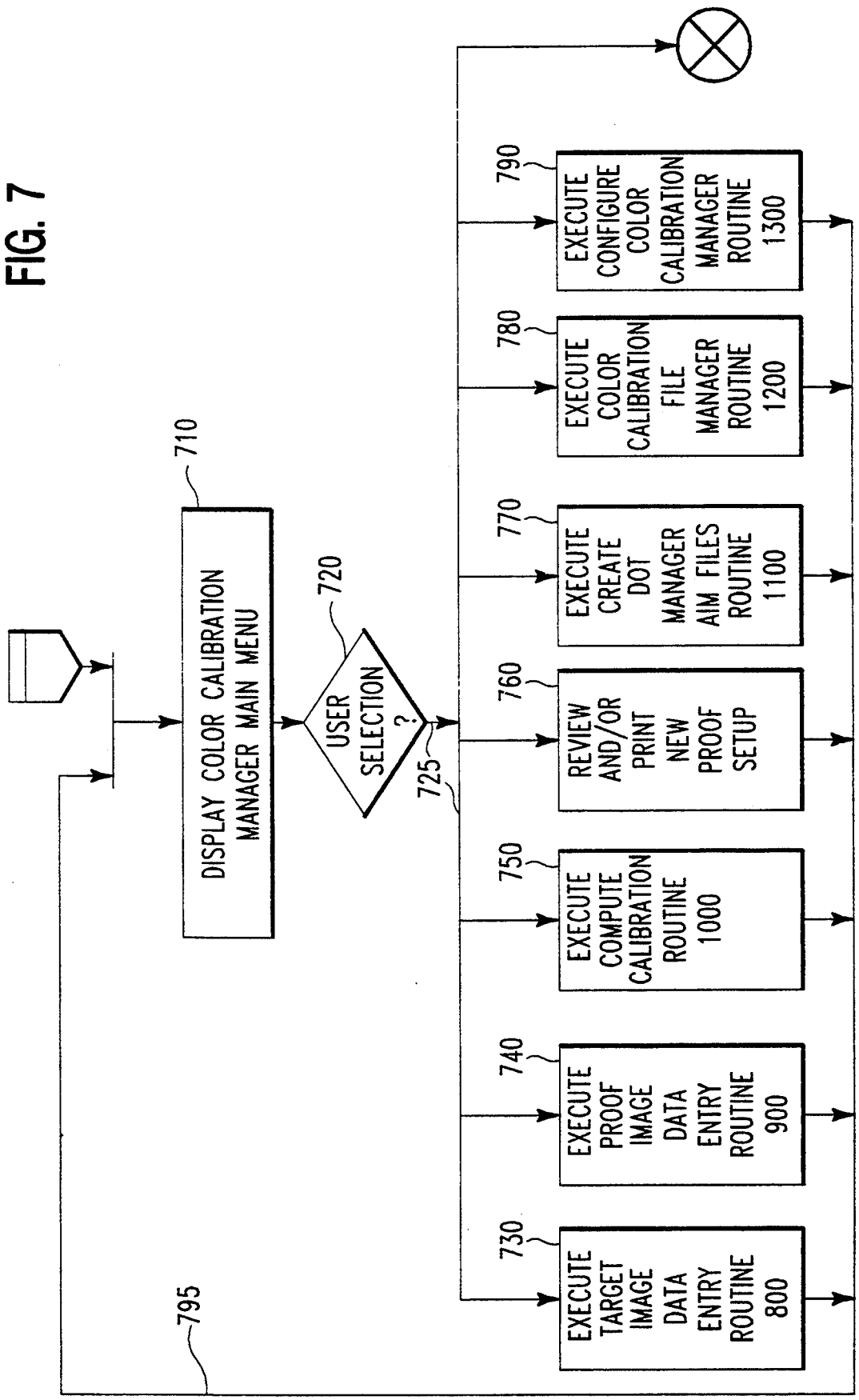
FIG. 7 depicts a flowchart of Color Calibration Manager Main routine 700 that is executed by computer 320 shown in FIG. 3.

FIG. 7 depicts my inventive process split into seven high level separately executable processes for execution within computer 320 (shown in FIG. 3) by associated routines, as shown in FIGS. 8-16 and described in detail below, implemented through a menu based user interface.

In particular, FIG. 7 depicts a flowchart of Color Calibration Manager Main routine 700 that is executed within computer 320 shown in FIG. 3. This routine creates a high level menu on a display screen at the computer and then initiates routines based upon user selection to perform desired portions of my inventive process.

Specifically, upon entry into routine 700, execution proceeds to block 710 which, when executed, displays a main menu on the display screen and prompts the user situated thereat to select an operation to be performed. Based upon a keyboard entry made by the user, decision block 720 then routes execution, via path 725, to any of blocks 730-790 or causes execution to exit both from this routine and the entire proof calibration process and return to a higher level operating procedure. Once any of blocks 730-790 has fully executed, execution merely loops back, via path 795, to block 710 to prompt the user for the next operation, and so on.

Block 730, when executed, invokes Target Image Data Entry routine 800, as described in detail below in conjunction with FIG. 8, to display a menu providing access to software which enables a user to obtain and manage colorimetric data for a target image, e.g., a press sheet.

Block 740, when executed, invokes Proof Image Data Entry routine 900, as described in detail below in conjunction with FIG. 9, to display a menu providing access to software which enables a user to obtain and manage colorimetric and densitometric data for a proof image.

Block 750, when executed, invokes Compute Calibration routine 1000, discussed in detail below in conjunction with FIG. 10, which, through implementing equations (14), (15) and (16), determines recommended changes in solid area and tint densities based upon measured data for a proof and press sheet.

Block 760, when executed, allows a user to view and, if desired, print new proof setup information previously obtained from execution of Compute Calibration routine 1000.

Block 770, when executed, causes execution of Create Dot Manager Aim Files routine 1100, discussed in detail below in conjunction with FIG. 11, which, through implementing equation (17), determines and saves recommended values of solid and tint densities based on changes previously obtained from execution of Compute Calibration routine 1000 and prior density values obtained through execution of Proof Image Data Entry routine 900.

Block 780, when executed, invokes Color Calibration File Manager routine 1200, as described in detail below in conjunction with FIG. 12, to display a menu providing access to software which enables a user to save, retrieve and delete colorimetric and densitometric data for target and proof images.

Block 790, when executed, invokes Configure Color Calibration Manager routine 1300, as described below in detail in conjunction with FIG. 13, to display a menu providing access to software which enables a user to choose among various options, e.g., the use of absolute or paper reference data.

Figure 8:
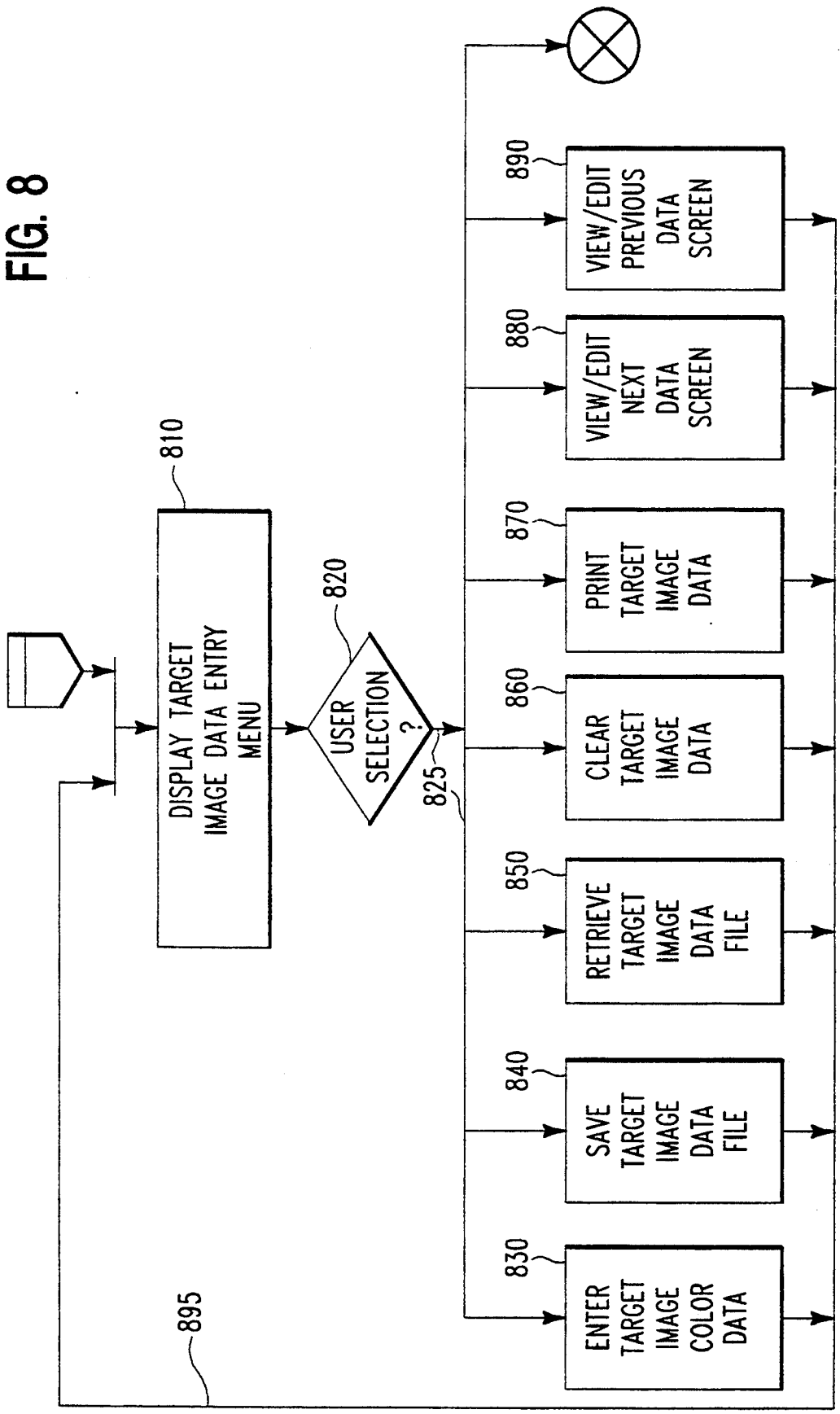
FIG. 8 depicts a flowchart of Target Image Data Entry routine 800 that is executed within Color Calibration Manager Main routine 700 shown in FIG. 7.

FIG. 8 depicts a flowchart of Target Image Data Entry routine 800 that is executed by Color Calibration Manager Main routine 700 shown in FIG. 7. Routine 800 creates a high level menu on a display screen at the computer and then initiates routines based upon user selection to perform desired portions of my inventive process associated with data related to target images.

Specifically, upon entry into routine 800 (as shown in FIG. 8), execution proceeds to block 810 which, when executed, displays a main menu on the display screen and prompts the user situated thereat to select an operation to be performed. Based upon a keyboard entry made by the user, decision block 820 then routes execution, via path 825, to any of blocks 830-890 or causes execution to exit from this routine and return to Color Calibration Manager Main routine 700. Once any of blocks 830-890 has fully executed, execution merely loops back, via path 895, to block 810 to prompt the user for the next operation, and so on. In each of blocks 830-890, the user is provided with an option to cancel the selected function and return to block 810.

Block 830, when executed, first determines if the data entry mode for color data entry from the target image is configured as manual or automatic. This configuration selection is described below in conjunction with FIG. 13. Thereafter, if the data entry mode is manual, the user is advised to fill in, using the keyboard and functions provided in blocks 880 and 890 discussed below, all data using templates provided on the display data screens. Alternatively, if the data entry mode is automatic, Automatic Color Data Entry routine 1400, discussed in detail below in conjunction with FIG. 14, is invoked, with the target image indicated as the object to be measured.

Block 840, when executed, displays a list of target files existing on data storage device 350 (see FIG. 3) and requests that the user enter a file name in order to specify a file into which the target image data will be saved. If the entered file name already exists, the user is asked for verification to overwrite this file before proceeding. If the user declines to overwrite the file, another file name is requested, entered and checked until verification is obtained or the latest named file is one which does not already exist. Thereupon, the user is prompted to provide a comment line to be included in the file; the target data is then saved in the file on data storage device 350, and execution is routed back, via path 895 (shown in FIG. 8), to block 810.

Block 850, when executed, displays a list of existing target files on data storage device 350 (see FIG. 3) and requests that a file name be provided in order to identify a file from which to retrieve previously saved target image data. If the entered file name does not exist, another file name is requested, entered and checked until a valid file name is obtained. Thereupon, the target data is retrieved from data storage device 350 and execution is routed back, via path 895 (shown in FIG. 8), to block 810.

Block 860, when executed, asks for user verification and if given, clears the current data structure that contains target image data.

Block 870, when executed, prints the current target image data (such as that currently entered or retrieved through execution of block 830 or 850, respectively) on a printer attached to computer 320 (see FIG. 3).

Block 880 (shown in FIG. 8), when executed, enables the user to view and, if desired, to edit target data that will appear on the next successive data screen. Similarly, block 890, when executed, enables the user to view and, if desired, to edit target data that appeared on an immediately prior data screen.

FIG. 9 depicts a flowchart of Proof Image Data Entry routine 900 that is also executed by Color Calibration Manager Main routine 700 shown in FIG. 7. Routine 900 creates a high level menu on a display screen at the computer and then initiates routines based upon user selection to perform desired portions of my inventive process associated with data related to proof images.

Specifically, upon entry into routine 900 (as shown in FIG. 9), execution proceeds to block 910 which, when executed, displays a main menu on the display screen and prompts the user situated thereat to select an operation to be performed. Based upon a keyboard entry made by the user, decision block 920 then routes execution, via path 925, to any of blocks 930–990 or causes execution to exit this routine and return to Color Calibration Manager Main routine 700. Once any of blocks 930–990 has fully executed, execution merely loops back, via path 995, to block 910 to prompt the user for the next operation, and so on. In each of blocks 930–990, the user is provided with an option to cancel the selected function and return to block 910.

Figure 14:
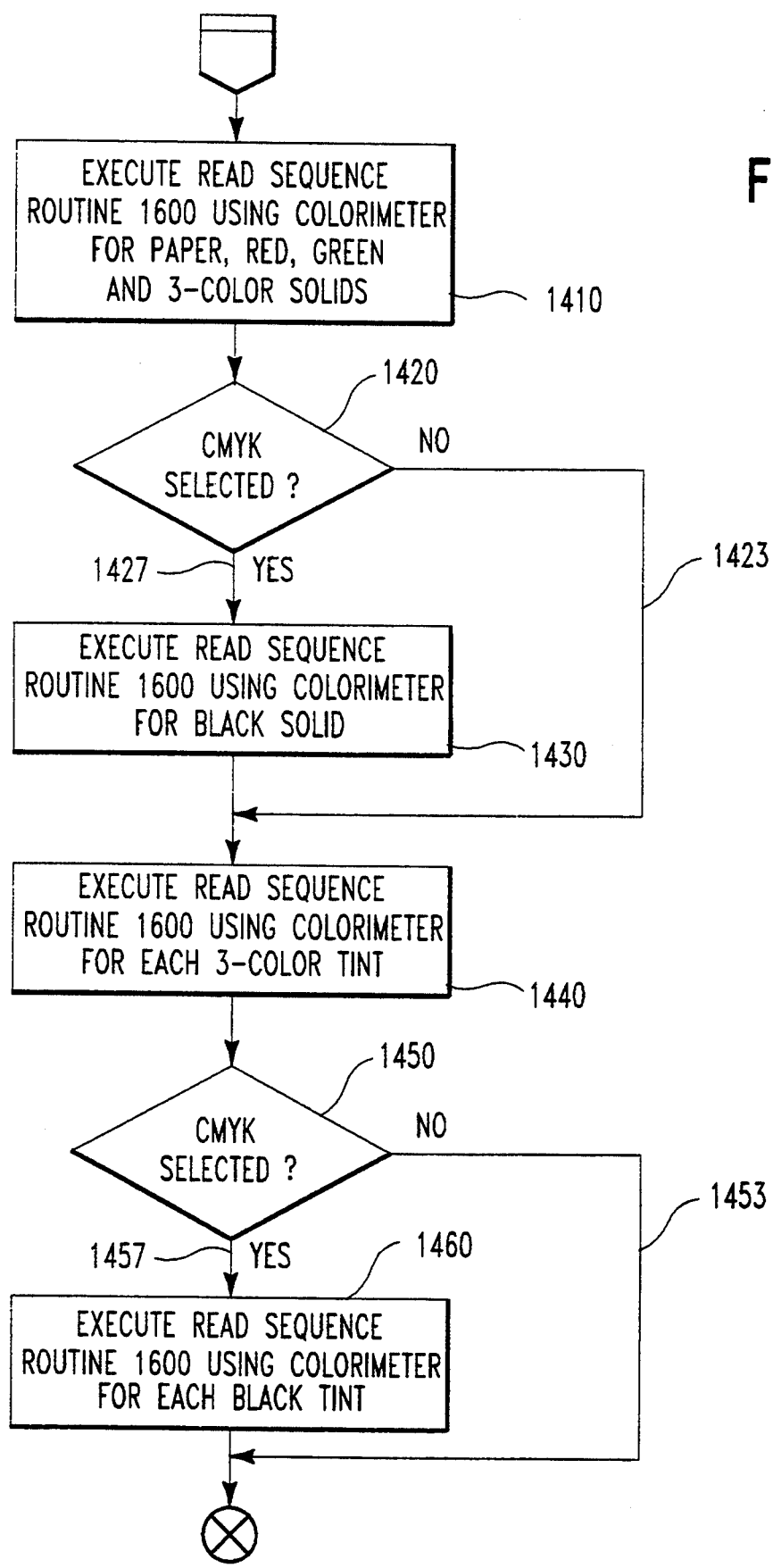
FIG. 14 depicts a flowchart of Automatic Color Data Entry routine 1400 that is optionally executed both in block 830 within Target Image Data Entry routine 800 shown in FIG. 8 and in block 930 within Proof Image Data Entry routine 900 shown in FIG. 9.
Figure 15:
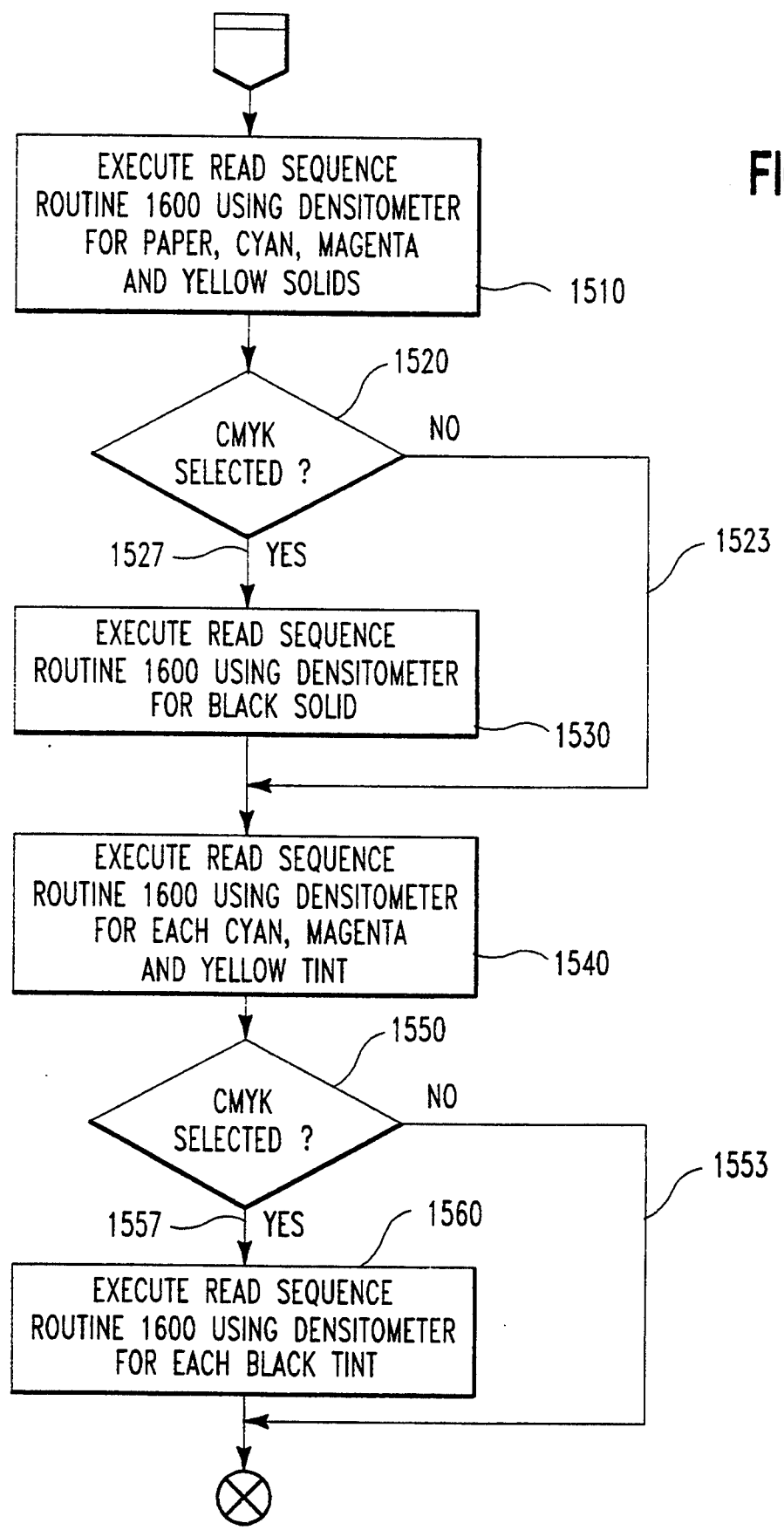
FIG. 15 depicts a flowchart of Automatic Density Data Entry routine 1500 that is optionally executed in block 940 within Proof Image Data Entry routine 900 shown in FIG. 9.

Block 930, when executed, first determines if the data entry mode for color data entry from the proof image is configured as manual or automatic. This configuration selection is described below in conjunction with FIG. 13. Thereafter, if the data entry mode is manual, the user is advised to fill in all data using templates provided on the display data screens, using the keyboard and functions provided in blocks 980 and 990, as discussed below. Alternatively, if the data entry mode is automatic, Automatic Color Data Entry routine 1400, discussed in detail below in conjunction with FIG. 14, and Automatic Density Data Entry routine 1500, discussed in detail below in conjunction with FIG. 15, are invoked, with the proof image indicated as the object to be measured.

Block 940, when executed, displays a list of proof files existing on data storage device 350 (see FIG. 3) and requests that the user enter a file name in order to specify a file into which proof image data will be saved. If the entered file name already exists, the user is asked for verification to overwrite this file before proceeding. If the user declines to overwrite the file, another file name is requested, entered and checked until verification is obtained or the latest named file is one which does not already exist. Thereupon, the user is prompted to provide a comment line to be included in the file; the proof data is then saved on data storage device 350, and execution is routed back, via path 995, to block 910.

Block 950, when executed, displays a list of existing proof data files on data storage device 350 and requests that a file name be provided from which to retrieve previously saved proof image data. If the entered file name does not exist, another file name is requested, entered and checked until a valid file name is obtained. Thereupon the proof data is retrieved from data storage device 350 and execution is routed back to block 910 via path 995.

Block 960, when executed, asks for user verification and if given, clears the current data structure that contains proof image data.

Block 970, when executed, prints the current proof image data (such as that currently entered or retrieved through execution of block 930 or 950, respectively) on the attached printer.

Block 980, when executed, enables the user to view and, if desired, to edit proof data that will appear on the next data screen. Similarly, block 990, when executed, enables the user to view and, if desired, to edit target data that has appeared on the prior data screen.

Figures 10, 10A:
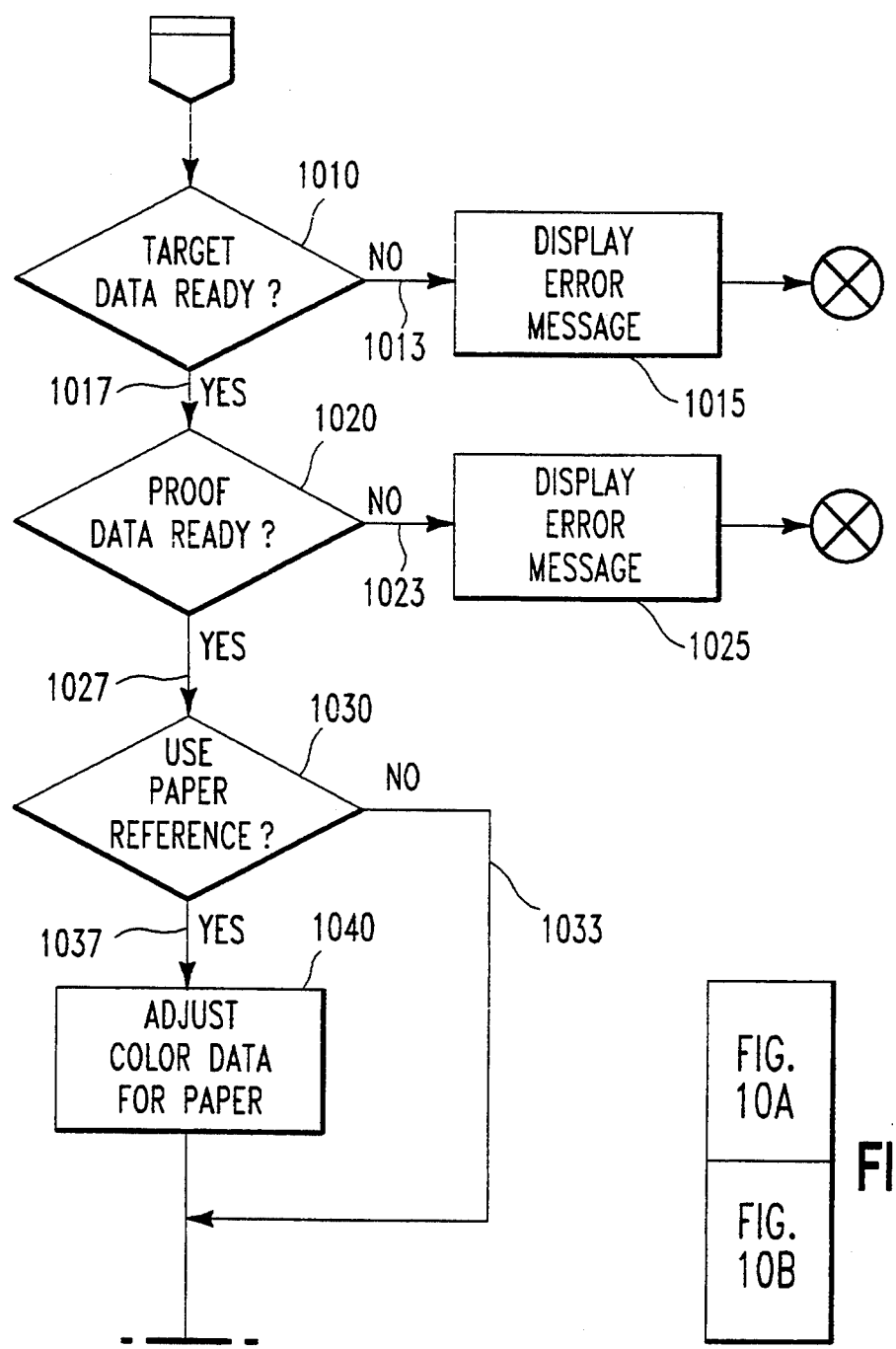
FIG. 10 depicts the correct alignment of the drawing sheets for FIGS. 10A and 10B.
FIGS. 10A and 10B collectively depict a flowchart of Compute Calibration routine 1000 that is also executed within Color Calibration Manager Main routine 700 shown in FIG. 7.
Figure 10B:
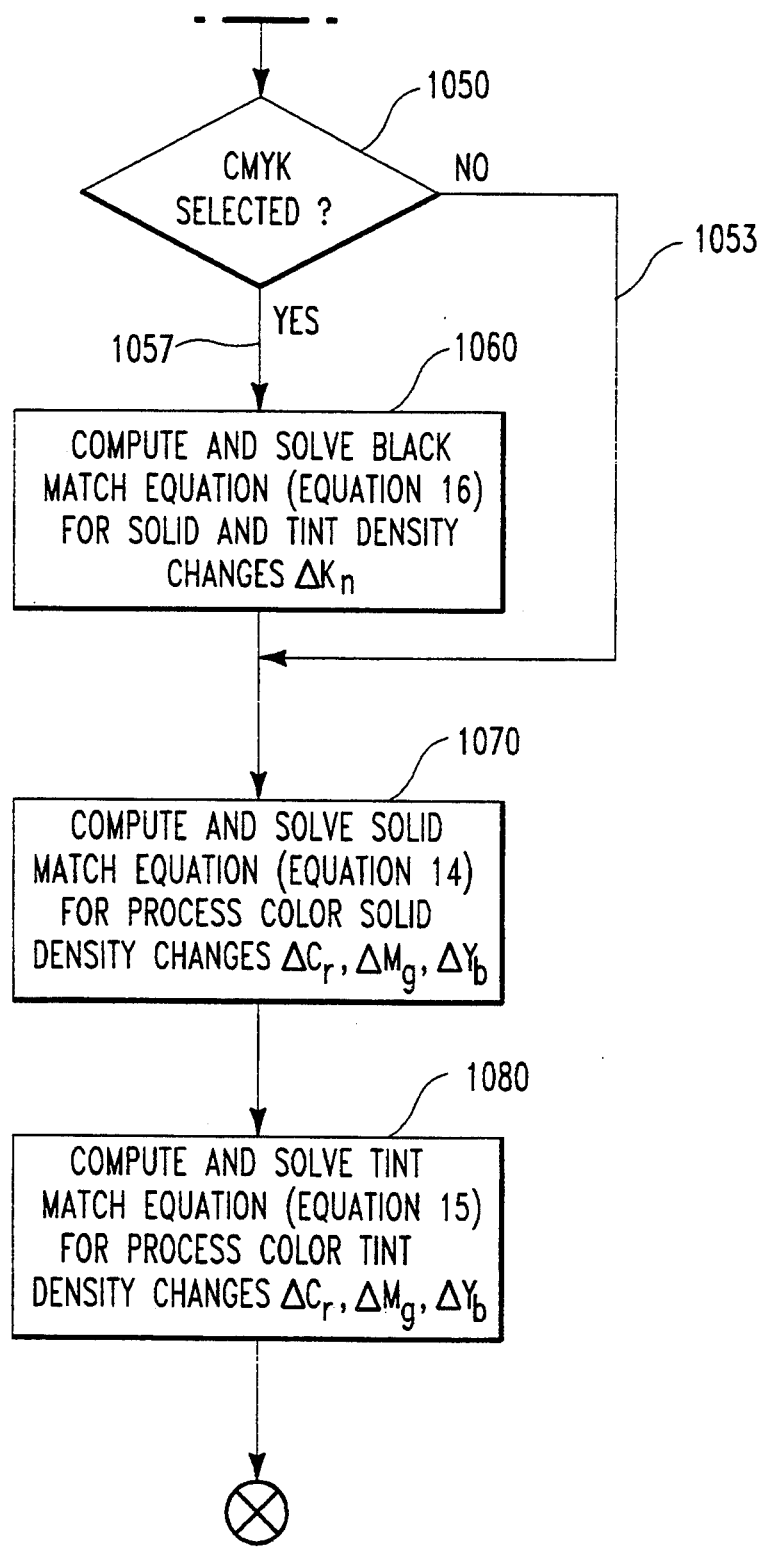

FIGS. 10A and 10B collectively depict a flowchart of Compute Calibration routine 1000 that is also executed by Color Calibration Manager Main routine 700 shown in FIG. 7; the correct alignment of the drawing sheets for FIGS. 10A and 10B is shown in FIG. 10. As noted above, routine 1000 (shown in FIGS. 10A and 10B), through implementing equations (14), (15) and (16), determines the recommended changes in solid area densities and tint dot areas based upon the measured data for both a proof and a press sheet.

Specifically, when routine 1000 is entered, execution proceeds to decision block 1010, wherein the existence of valid target data is ascertained. If valid target data is not available, execution proceeds by "NO" path 1013 to block 1015. This latter block, when executed, displays an appropriate error message to the user. Thereafter, execution exits from routine 1000 and returns to Color Calibration Manager Main routine 700.

Alternatively, if valid target data is available, execution proceeds, via "YES" path 1017, to decision block 1020, wherein the existence of valid proof data is ascertained. If valid proof data is not available, execution proceeds, via "NO" path 1023, to block 1025. This latter block displays an appropriate error message to the user. Thereafter, execution exits from routine 1000 and returns to Color Calibration Manager Main routine 700.

Alternatively, if valid proof data is available, execution proceeds, via "YES" path 1027, to decision block 1030, wherein the use of paper as reference white for CIELAB coordinates is ascertained by consulting the configuration defined in Configure Color Calibration Manager routine 1300 (which will be discussed in detail below in conjunction with FIG. 13). If paper is to be used as reference white, execution proceeds, via path 1037, to block 1040 wherein absolute CIELAB coordinates for colors and paper are converted to paper reference CIELAB coordinates using equation (1). Pseudo-code for conversion of CIELAB coordinates for a single color and paper to paper reference values is shown in Table 1 below and will be discussed shortly. Upon completion of coordinate conversion, execution proceeds to decision block 1050. Alternatively, if paper reference values are not to be used, execution proceeds, via "NO" path 1033, directly to decision block 1050.

Decision block 1050 ascertains whether black printer appearance match equation (i.e. equation 16) is to be solved by consulting the configuration defined through Configure Color Calibration Manager routine 1300 (to be discussed in detail below in conjunction with FIG. 13). If the black match equation is to be solved, execution proceeds, via "YES" path 1057, to block 1060. In block 1060, equation (16) is used, in turn, to convert target and proof L* data into proof density changes ($\Delta K_n$) for black solids and tints. Pseudo-code to accomplish this is shown below in Table 2 and will be discussed shortly. Upon completion of this computation for the black solid and tint areas, as defined in the configuration, execution passes to block 1070. Alternatively, if black match equation (16) is not to be solved, execution proceeds by "No" path 1053 to block 1070.

Through execution of block 1070, equation (14) is formulated and solved for process color solid density changes in C, M and Y ($\Delta C_r$, $\Delta M_g$ and $\Delta Y_b$). Pseudo-code for the procedure used in this block is in Table 3 below and will also be discussed shortly. Also included in Table 3 are illustrative values for the sensitivity coefficients used in forming equation (14). After computing the solution to equation (14), execution proceeds to block 1080.

In block 1080, equation (15) is formulated and solved for process color tint density changes in C, M and Y ($\Delta C_r$, $\Delta M_g$ and $\Delta Y_b$). Pseudo-code for the procedure used in this block is in Table 4 below and will be discussed shortly. After computing the solutions to equation (15) for all tint areas defined in the configuration, execution exits from routine 1000 and returns to Color Calibration Manager Main routine 700.

Figures 11, 11A:
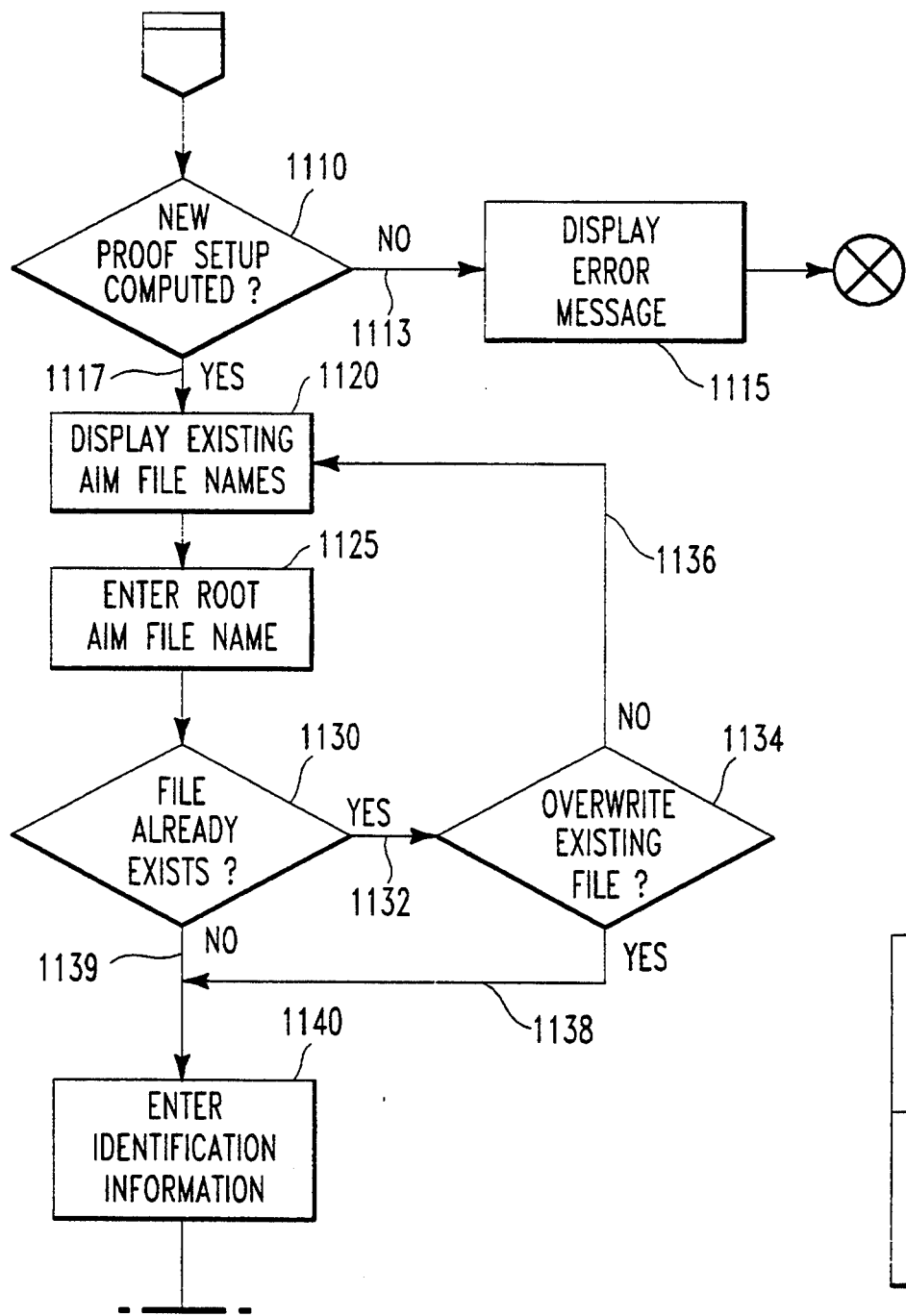
FIG. 11 depicts the correct alignment of the drawing sheets for FIGS. 11A and 11B.
FIGS. 11A and 11B collectively depict a flowchart of Create Dot Manager Aim Files routine 1100 that is also executed within Color Calibration Manager Main routine 700 shown in FIG. 7.
Figure 11B:
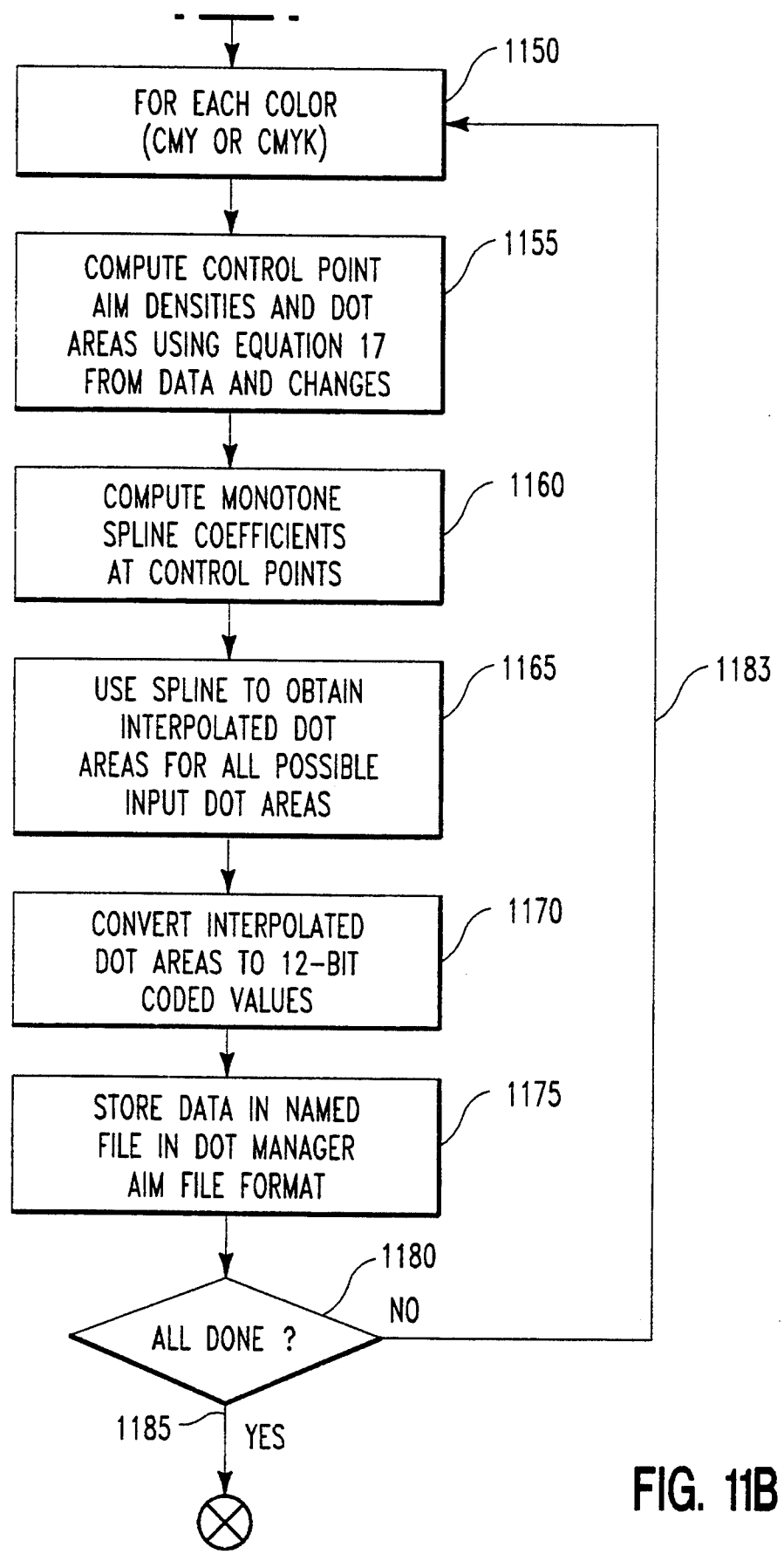

FIGS. 11A and 11B collectively depict a flowchart of Create Dot Manager Aim Files routine 1100 that is also executed by Color Calibration Manager Main routine 700 shown in FIG. 7; the correct alignment of the drawing sheets for FIGS. 11A and 11B is shown in FIG. 11. As noted above, routine 1100 (shown in FIGS. 11A and 11B), through implementing equation (17), determines and saves the recommended values of solid and tint densities based on changes previously obtained from execution of Compute Calibration routine 1000 and prior density values obtained through execution of Proof Image Data Entry routine 900.

Specifically, upon entry to routine 1100, execution proceeds to decision block 1110 which determines if a new proof setup has been completed, i.e. whether routines 900 and 1000 have just been executed. If not, an error condition has occurred and execution is routed, via "NO" path 1113, to block 1115. This block displays an appropriate error message to the user and causes execution to exit from routine 1100 and return to Color Calibration Manager Main routine 700. Alternatively, if routines 900 and 1000 have just been executed, execution is routed, via path 1117, to block 1120.

When executed, block 1120 causes a list of existing "Aim" file names to appear on the computer display screen for perusal by the user. Execution then passes to block 1125 which permits the user to enter a root file name. This root file name is then modified by appending a color dependent extension for each specific color data file that will be created to separately store "Aim" dot gain values for each separation for the proof. Execution then passes to decision block 1130 which, when executed, checks each extended root file name against a list of existing file names for duplication. If any named file already exists, decision block 1130 routes execution, via "YES" path 1132, to decision block 1134. Through the latter decision block, a prompt requesting permission to overwrite the file is displayed, with the user response thereto then obtained and tested. If the user refuses to grant overwrite permission, execution returns, via "NO" path 1136, to block 1120 to display the list of file names again, and so on. Alternatively, if the user grants overwrite permission, execution passes, via "YES" path 1138, to block 1140. If, however, decision block 1130 determines that the named file does not yet exist, execution proceeds, via "NO" path 1139, directly to block 1140. In this way, a valid extended file name for each color "Aim" dot gain file is obtained before execution of steps required to save the new proof "Aim" dot area data.

When executed, block 1140 prompts the user to enter identification information in the "Aim" dot area files. Upon entry of any such information through the keyboard, execution passes to block 1150.

Block 1150, when first executed, initializes a list of colors to that selected in the current configuration as defined in Configure Color Calibration Manager routine 1300 to be discussed in detail below in conjunction with FIG. 13. Whether block 1150 is entered from block 1140 or subsequently from block 1180, via path 1183, as discussed below, the next color is selected from the color list and execution proceeds to block 1155.

Block 1155, when executed, adds the density changes to measured proof density values obtained through execution of Proof Image Data Entry routine 900 for the current color to compute recommended tint and solid area density values. Then, equation (17) is used within block 1155 to compute recommended, or "Aim", output dot areas for each input dot area value using the Yule-Nielsen equation, with the dot area values and "n" value as defined by default or through execution of Configure Color Calibration Manager routine 1300 (this routine will be discussed shortly). Upon completion of the dot area computations in block 1155, execution is routed to block 1160.

Block 1160 first determines, through use of "Aim" dot area control points (these points comprising several input and output dot area pairs for which recommended output dot areas were computed in block 1155), the coefficients of a monotone piecewise cubic interpolant function that passes through each pair of adjacent control points. Thereafter, block 1160 interpolates between each pair of control points with a monotone cubic polynomial and preserves the continuity of derivative at each interior control point. The use of a monotone piecewise cubic function imparts a needed degree of curvature to the "Aim" data that accurately predicts the actual physical performance of an imaging chain between two control points. This interpolation process is described in detail in, e.g., F. N. Fritsch et al, "Monotone Piecewise Cubic Interpolation", *SIAM Journal of Numerical Analysis*, Vol. 17, No. 2, April 1980, pages 238-246 (hereinafter referred to as the Fritsch et al paper), which is incorporated by reference herein. In utilizing the interpolation method described in the Fritsch et al paper, I chose, as described on page 242 of this paper, to employ set 2 as a constraint on each interpolant function. Inasmuch as the detailed steps for undertaking monotone piecewise cubic interpolation in accordance with the method described in the Fritsch et al paper would be readily apparent to anyone skilled in the art, then, for the sake of brevity, I have omitted all such details from the following discussion.

Once all the coefficients of all the interpolant functions for the "Aim" dot area control points have been determined, then execution proceeds to block 1165. This block, when executed, evaluates the interpolant function for each and every interval such that an interpolated "Aim" dot area value will be generated for each possible incremental input dot area, illustratively areas encoded by each incremental 8-bit input value, i.e. from "0" to "255". Specifically, the interpolant function associated with each interval is successively evaluated at those particular input values which fall on the end of or within that interval to yield corresponding output dot areas. Once the list of output dot areas is generated, execution proceeds to block 1170 wherein these dot areas are encoded in 12-bit form, illustratively by multiplication by 40.95 followed by rounding. Finally, execution proceeds to block 1175 wherein the identification information entered by the user in block 1140, the "Aim" control point data and interpolated data are all written to a file in a format compatible with subsequent use with a tone reproduction control system such as that described in the '940 Spence application. Having written the file, execution proceeds to decision block 1180.

In decision block 1180, if the dot area data for the last color in the sequence has been saved, execution proceeds via "Yes" path 1185, to exit from routine 1100 and return to routine 700. Otherwise, if all colors have not yet been processed, execution returns, via "NO" path 1183, to block 1150 wherein the next color in sequence is selected, and so on until data for all these colors has been separately processed.

FIG. 12 depicts a flowchart of Color Calibration File Manager routine 1200 that is also executed by Color Calibration Manager Main routine 700 shown in FIG. 7. Routine 1200 (shown in FIG. 12) creates a high level menu on a display screen at the computer and then initiates routines based upon user selection to perform desired functions associated with calibration data file management.

Specifically, upon entry into routine 1200, execution proceeds to block 1210 which, when executed, displays a main menu on the display screen and prompts the user situated thereat to select an operation to be performed. Based upon a keyboard entry made by the user, decision block 1220 then routes execution, via path 1225, to any of blocks 1230-1280 or causes execution to exit this routine and return to Color Calibration Manager Main routine 700. Once any of blocks 1230-1280 has fully executed, execution merely loops back, via path 1285, to block 1210 to prompt the user for the next operation, and so on. In each of blocks 1230-1280, the user is provided with an option to cancel the selected function and return to block 1210.

Blocks 1230, 1240, 1260 and 1270, when executed, provide identical capability to blocks 840, 850, 940 and 950 respectively, as discussed previously in discussion of FIGS. 8 and 9, namely either saving or retrieving either target or proof data to or from data storage device 350 (see FIG. 3). Blocks 1250 and 1280 (as shown in FIG. 12) provide an additional capability to delete a named file, after verification, from the target and proof files, respectively, stored on data storage device 350.

Figure 13:
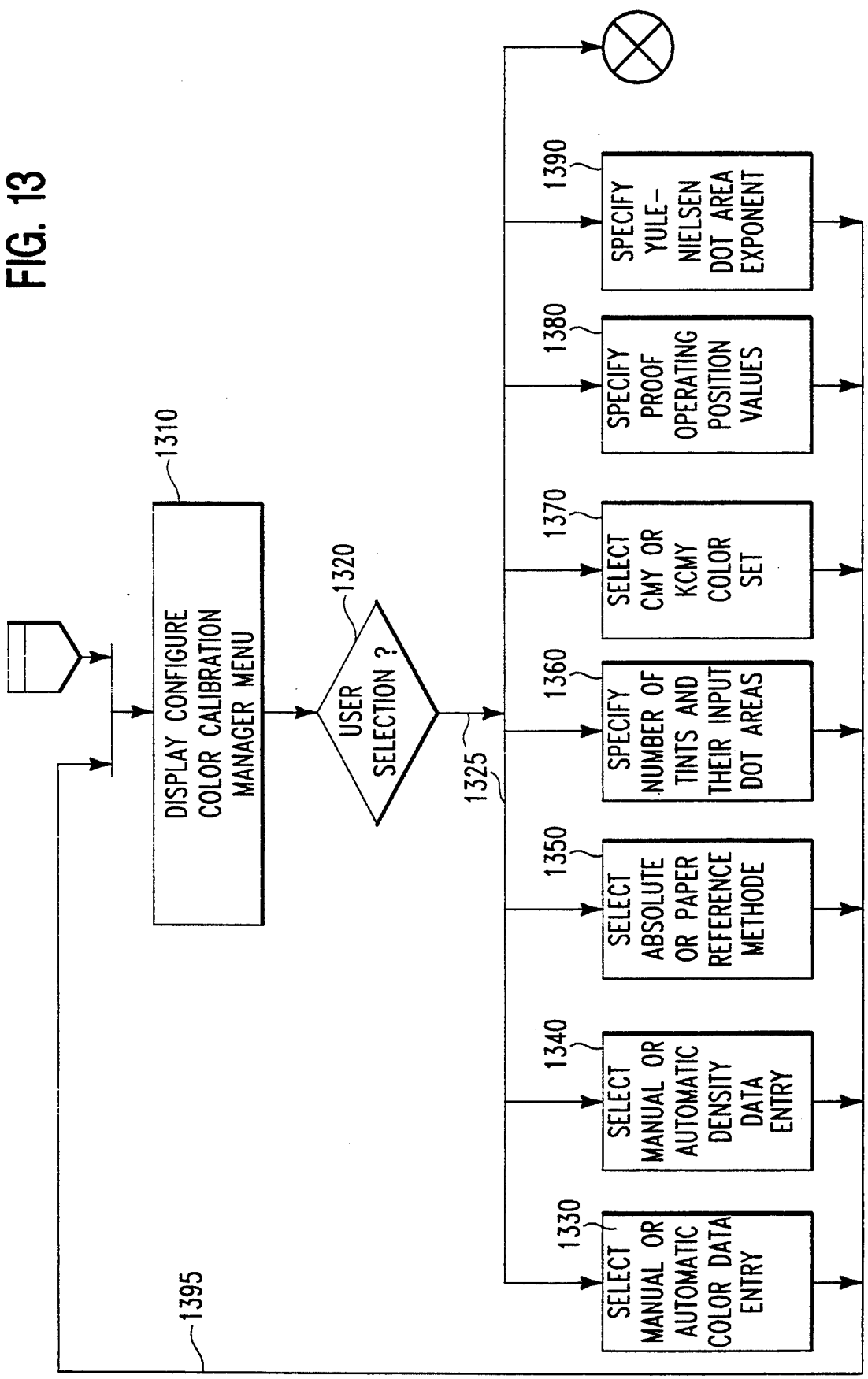
FIG. 13 depicts a flowchart of Configure Color Calibration Manager routine 1300 that is also executed within Color Calibration Manager Main routine 700 shown in FIG. 7.

FIG. 13 depicts a flowchart of Configure Color Calibration Manager routine 1300 that is executed within block 790 of Color Calibration Manager Main routine 700 shown in FIG. 7. Routine 1300, which provides a high level menu interface, customizes the computations of my inventive process regarding image data entry, reference white, number and dot areas of tint patches, color set, operating position values and dot area calculations.

Specifically, upon entry into routine 1300, execution proceeds to block 1310 which, when executed, displays a high level menu on the display screen and prompts the user situated thereat to select an operation to be performed. Based upon a keyboard entry made by the user, decision block 1320 then routes execution, via path 1325, to any of blocks 1330-1390 or causes execution to exit this routine and return to Color Calibration Manager Main routine 700. Once any of blocks 1330-1390 has fully executed, execution merely loops back, via path 1395, to block 1310 to prompt the user for the next operation, and so on. In each of blocks 1330-1390, the user is provided with an option to cancel the selected function and return to block 1310.

When executed, block 1330 permits the user to select automatic or manual data entry for color data. In the event automatic entry is chosen, a diagnostic sequence which tests for the presence of color measurement device 310 (see FIG. 3) is first executed. If this device is not present, the user is notified and manual entry of color data is selected. Upon cancellation or acceptance of any changes, execution of block 1330 (shown in FIG. 13) terminates.

Block 1340, when executed, permits the user to select automatic or manual data entry for density data. In the event automatic entry is chosen, a diagnostic sequence which tests for the presence of density measurement device 340 (see FIG. 3) is first executed. If the device is not present, the user is notified and manual entry of density data is selected. Upon cancellation or acceptance of any changes, execution of block 1340 (shown in FIG. 13) terminates.

Through execution of block 1350, the user selects usage of absolute or paper reference CIELAB coordinates in the computations performed within Compute Calibration routine 1000 (see FIGS. 10A and 10B). Upon cancellation or acceptance of any change, execution of block 1350 terminates.

Block 1360 (shown in FIG. 13), when executed, first presents the user with a choice of number of tint dot areas for which appearance matching is desired, with a default value of five (5) or any current value from prior execution of this particular block. Upon user selection of a desired number of dot areas, the user is then presented, through block 1360, with either a list of current or default dot areas, the latter appearing if the number is not changed or an empty list if the number is changed. The default dot areas used in conjunction with the default number of five is 5%, 15%, 25%, 50% and 75%. The user may freely edit any of these areas provided the resulting areas form an increasing sequence with the largest dot area not exceeding 90%. Upon cancellation or acceptance of any changes, execution of block 1360 terminates.

Through execution of block 1370, the user is presented with an option of using a color set of KCMY, i.e. all four primary process colors black, cyan, magenta and yellow, or a color set of CMY, i.e. bypassing the independent determination of black lightness matching. Upon cancellation or acceptance of any changes, execution of block 1370 terminates.

Block 1380, when executed, presents the user with an option of entering proof operating position information to be incorporated in "Aim" dot area files created in routine 1100 (see FIGS. 11A and 11B). This information comprises screen rulings and density setpoints used in producing the proof image. Default values of 150 for screen ruling and zero (0) for density setpoints are provided in case this block is not executed. Upon cancellation or acceptance of any changes, execution of block 1380 (shown in FIG. 13) terminates.

When executed, block 1390 presents the user with an option of entering an "n" value to be used in performing output dot area computations that are to be incorporated within "Aim" dot area files created in routine 1100 (see FIGS. 11A and 11B). The default value for "n" is one (1) with valid values ranging from one to four (4). Upon cancellation or acceptance of any changes, execution of block 1390 (shown in FIG. 13) terminates.

FIG. 14 depicts a flowchart of Automatic Color Data Entry routine 1400 that is executed both within block 830 of Target Image Data Entry routine 800 shown in FIG. 8, wherein the target is selected as the image to be measured, and within block 930 of Proof Image Data Entry routine 900 shown in FIG. 9, wherein the proof is selected as the image to be measured. As noted above, routine 1400, as shown in FIG. 14, obtains colorimetric data from either a target image or a proof image. This routine guides the user through a sequence of colorimeter measurements on the selected image and executes Read Sequence routine 1600 (shown in FIG. 16 and discussed in detail below) in conjunction with each such measurement.

Specifically, upon entry to routine 1400, execution proceeds to block 1410 wherein the colorimeter is first selected as the measurement instrument. Thereafter, paper, red solid, green solid and three-color solid are selected in turn by this block and Read Sequence routine 1600 is executed for each. Upon completion of these readings, execution proceeds to decision block 1420.

Through execution of decision block 1420, the color set configuration is checked to see if black is to be included. If black is not to be included, execution proceeds, via "NO" path 1423, directly to block 1440. Alternatively, if black is to be included, execution proceeds to block 1430 wherein black solid is selected and Read Sequence routine 1600 is then executed. Upon completion of block 1430, execution proceeds to block 1440.

In block 1440, three-color is selected and each of the dot areas selected in the configuration is successively selected with Read Sequence routine 1600 being separately executed therefor. Upon completion of block 1440, execution proceeds to decision block 1450.

Through execution of decision block 1450, the color set configuration is again checked to see if black is to be included. If black is not to be included, execution proceeds, via "NO" path 1453, to exit from routine 1400 and return to block 830 of Target Image Data Entry routine 800 or to block 930 of Proof Image Data Entry routine 900, based on whichever block caused routine 1400 to execute. Alternatively, if black is to be included, execution proceeds to block 1460 wherein black is selected and each different dot area black tint is selected, in turn, with Read Sequence routine 1600 being executed therefor. Upon completion of block 1460, execution exits from 1400 and returns either to block 830 of routine 800 or to block 930 of routine 900, whichever caused routine 1400 to execute.

FIG. 15 depicts a flowchart of Automatic Density Data Entry routine 1500 that is executed within block 930 of Proof Image Data Entry routine 900 shown in FIG. 9. As noted above, routine 1500, as shown in FIG. 15, obtains densitometric data for a proof. This routine guides the user through a sequence of densitometer measurements on a proof, and executes Read Sequence routine 1600, shown in FIG. 16 and discussed in detail below, for each such measurement.

Specifically, upon entry to routine 1500, execution proceeds to block 1510. Through this block, the densitometer is selected as the measurement instrument. Thereafter, the proof is selected as the image to be measured. Then paper, cyan solid, magenta solid and yellow solid are selected in turn and Read Sequence routine 1600 is executed for each. Upon completion of these readings, execution proceeds to decision block 1520.

Through decision block 1520, the color set configuration is checked to ascertain whether black is to be included. If black is not to be included, execution proceeds, via "NO" path 1523, directly to block 1540. Alternatively, if black is to be included, execution proceeds to block 1530 wherein black solid is selected and Read Sequence routine 1600 is executed therefor. Upon completion of block 1520, execution proceeds to block 1540.

When executed, block 1540 successively selects each of the colors cyan, magenta and yellow, and for each such color successively selects each dot area specified in the configuration and executes Read Sequence routine 1600 therefor. Upon completion of block 1540, execution proceeds to decision block 1550.

Decision block 1550, when executed, again checks the color set configuration to determine if black is to be included. If black is not to be included, execution proceeds, via "NO" path 1553, to exit from routine 1500 and return to block 930 of Proof Image Data Entry routine 900. Alternatively, if black is to be included, execution proceeds, via "YES" path 1557, to block 1560 wherein black is selected and then each specified dot area is successively selected in turn with Read Sequence routine 1600 being executed therefor. Upon completion of block 1560, execution exits from routine 1500 and returns to block 930 of Proof Image Data Entry routine 900.

Figure 16:
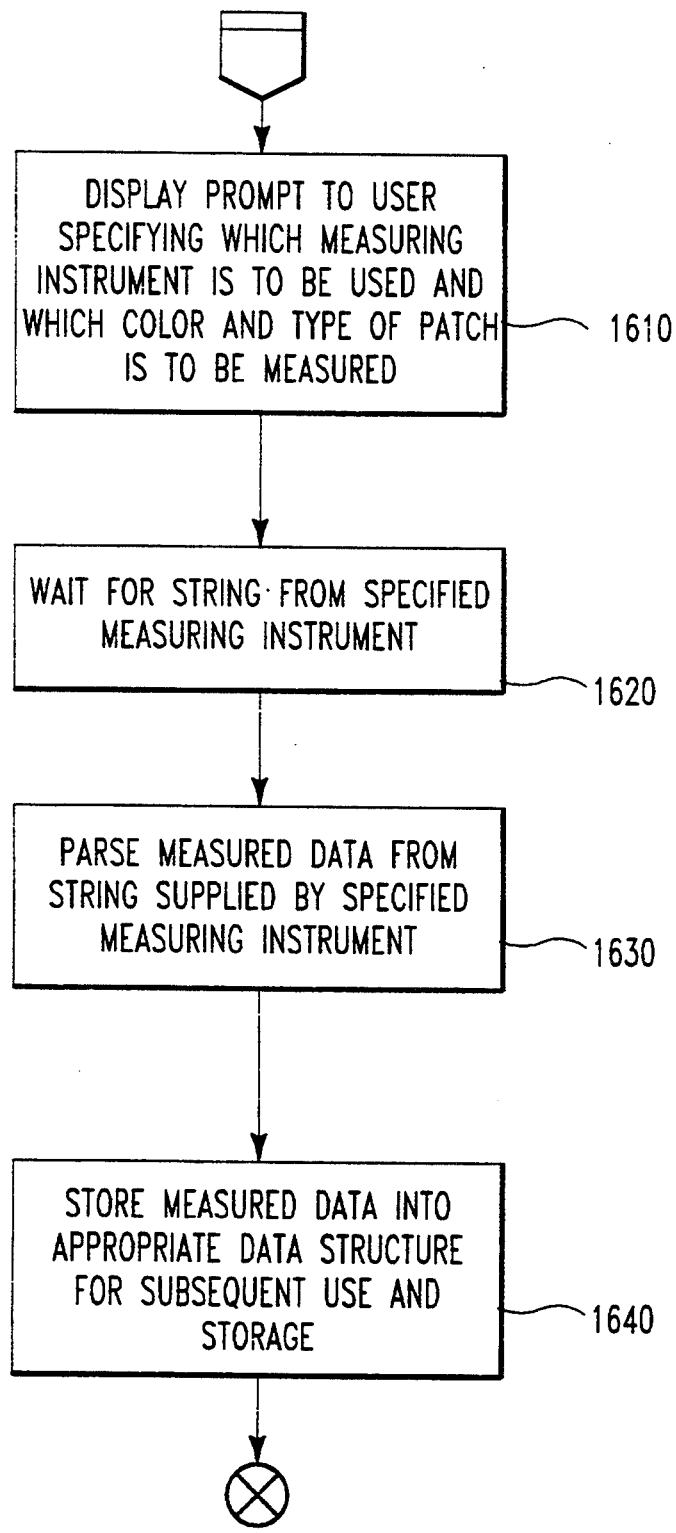
FIG. 16 depicts a flowchart of Read Sequence routine 1600 that is executed in blocks 1410, 1430, 1440 and 1460 within Automatic Color Data Entry routine 1400 shown in FIG. 14 and in blocks 1510, 1530, 1540 and 1560 within Automatic Density Data Entry routine 1500 shown in FIG. 15.

FIG. 16 depicts a flowchart of Read Sequence routine 1600. This routine provides a convenient interface among the user, the instrument and the color calibration software for obtaining measurement data.

Specifically, upon invocation of routine 1600, execution first proceeds to block 1610 which displays to the user a measurement attribute prompt comprising instrument, image, color and type of patch. By way of illustration, the instrument can be a densitometer or colorimeter; the image can be target or proof; the color can be white, cyan, magenta, yellow, black, red, green or three-color; and the type of patch can be solid or a known percentage tint. Each of the measurement attributes is selected in the routine invoking Read Sequence routine 1600. Once this prompt is displayed, execution proceeds to block 1620.

In block 1620, computer 320 (see FIG. 3) waits for a string of data to be sent by the measurement instrument. Upon receipt of the string, execution passes to block 1630 (shown in FIG. 16). In block 1630, the string received is parsed according to rules appropriate to the specified instrument. Thereafter, execution proceeds to block 1640. Finally, in block 1640, the measured data is stored, for subsequent use and storage, in computer 320 in a data structure defined by the image, color and patch type. Once this data has been stored, execution returns to the block that invoked Read Sequence routine 1600.

2. Pseudo-code

The following pseudo-code procedure shown in Table 1 below can be used, within block 1040, to calculate paper reference CIELAB coordinates. This calculation first inverts equation (1) to recover tristimulus ratios for a color (i.e. color_lab) and paper (i.e. paper_lab) and then applies this equation to ratios formed therefrom to determine the paper reference CIELAB coordinates (i.e. color_lab_paper).

TABLE 1

PSEUDO-CODE FOR PAPER REFERENCE
CIELAB COORDINATE CALCULATION PROCEDURE

```
Procedure Paper_Ref(color_lab, paper_lab,
color_lab_paper);
/*
This procedure converts L*a*b* triplets for a color and
paper into a paper reference L*a*b* triplet.
*/
x_ratio_color = ((color_lab[1]+16)/116
                 + color_lab[2]/500) ^ 3;
y_ratio_color = ((color_lab[1]+16)/116) ^ 3;
z_ratio_color = ((color_lab[1]+16)/116
                 − color_lab[3]/200) ^ 3;
x_ratio_paper = ((paper_lab[1]+16)/116
                 + paper_lab[2]/500) ^ 3;
y_ratio_paper = ((paper_lab[1]+16)/116) ^ 3;
z_ratio_paper = ((paper_lab[1]+16)/116
                 − paper_lab[3]/200) ^ 3;
color_lab_paper[1] =
   116*(y_ratio_color/y_ratio_paper) ^ (⅓) − 16;
color_lab_paper[2] =
   500*((x_ratio_color/x_ratio_paper) ^ (1/3) −
        (y_ratio_color/y_ratio_paper) ^ (1/3));
color_lab_paper[3] =
   200*((y_ratio_color/y_ratio_paper) ^ (1/3) −
        (z_ratio_color/z_ratio_paper) ^ (1/3));
end;
```

The following pseudo-code procedure shown in Table 2 below can be used, within block 1060, to calculate the recommended changes in solid and tint black density. Since the same equation, i.e. equation (16), is used to match both the solid and tint black densities between the proof and the press sheet, this pseudo-code is separately executed for each pair of black test patches.

TABLE 2

PSEUDO-CODE FOR RECOMMENDED BLACK DENSITY
CHANGE PROCEDURE

```
Procedure_Calculate_Recommended_Black_Density_Change
/*This procedure calculates recommended changes in black
N densities to match the proof and press sheet (target)
L* coordinates.
This procedure calculates the change for one test patch
at a time in the proof.
   variable names and meanings
   delta_K_v          recommended change in black density
   K_Lstar_target     L* coordinate of target black patch
   K_Lstar_proof      L* coordinate of proof black patch */
delta_K_v = −3.0 *
   log10((K_Lstar_target+16)/(K_Lstar_proof+16));
end;
```

The following pseudo-code procedure shown in Table 3 below can be used, within block 1070, to calculate, through formulation and direct solution of the combined process model and match principle inherent in equation (14), the recommended changes in the solid process colors C, M and Y based upon red and green (two-color overprint) a*b* hue angle matching and three-color (near neutral) L* coordinate matching. This procedure includes illustrative values of the corresponding sensitivity coefficients, S, for changes in the two-color (R and G) and three-color (N) overprints. As written, this procedure takes advantage of the special structure of the coefficient matrix in the solution of equation (14).

TABLE 3

PSEUDO-CODE FOR RECOMMENDED SOLID DENSITY
CHANGE PROCEDURE

```
Procedure Calculate_Recommended_Solid_Density_Changes
/*This procedure implements the solid area match
principles of matching red and green (two-color
overprint) hue angle and 3-color L* coordinate values
   variable names and meanings
   G_astar_proof    a* coordinate of proof green solid
   G_bstar_proof    b* coordinate of proof green solid
   R_astar_proof    a* coordinate of proof red solid
   R_bstar_proof    b* coordinate of proof red solid
   N_Lstar proof    L* coordinate of proof 3-color solid
   G_astar_target   a* coordinate of target green solid
   G_bstar_target   b* coordinate of target green solid
   R_astar_target   a* coordinate of target red solid
   R_bstar_target   b* coordinate of target red solid
   N_Lstar_target   L* coordinate of target 3-color solid
   S_G_astar(3)     sensitivities of G_a* to C_r, M_g, and Y_b
   S_G_bstar(3)     sensitivities of G_b* to C_r, M_g, and Y_b
   S_R_astar(3)     sensitivities of R_a* to C_r, M_g, and Y_b
   S_R_bstar(3)     sensitivities of R_b* to C_r, M_g, and Y_b
   S_N_Lstar(3)     sensitivities of N_L* to C_r, M_g, and Y_b
   mtx(3,3)   matrix of match principle coefficients
   err(3)     vector of match principle errors
   delta_Y_b  recommended change in yellow density
   delta_M_g  recommended change in magenta density
   delta_C_r  recommended change in cyan density       */
S_G_astar = [−20,   0,   7];
S_G_bstar = [−30,   0,  70];
S_R_astar = [  0,  18,  −2];
S_R_bstar = [  0, −13,  66];
S_N_Lstar = [−13, −14,   3];
/*form matching matrix (G, R and N equations)*/
for j = 1:3;
   mtx(1,j) = G_bstar_target*S_G_astar(j) −
              G_astar_target*S_G_bstar(j);
   mtx(2,j) = R_bstar_target*S_R_astar(j) −
```

TABLE 3-continued
PSEUDO-CODE FOR RECOMMENDED SOLID DENSITY CHANGE PROCEDURE

```
                R_astar_target*S_R_bstar(j);
    mtx(3,j) = S_N_Lstar(j);
end;
/*form error vector (G, R and N errors) */
err(1) = G_astar_target*G_bstar_proof -
         G_bstar_target*G_astar_proof;
err (2) = R_astar_target*R_bstar_proof -
          R_b_star_target*R_astar_proof;
err(3) = N_Lstar_target - N_Lstar_proof;
/*use R and G equations to eliminate C and M terms in N
equation*/
mtx(3,3) = mtx(3,3) -    mtx(3,1)*mtx(1,3)/mtx(1,1) -
                         mtx(3,2)*mtx(2,3)/mtx(2,2);
err(3) = err(3) -        mtx(3,1)*err(1)/mtx(1,1) -
                         mtx(3,2)*err(2)/mtx(2,2);
/*solve resulting N equation for change in yellow*/
delta_Y_b = err(3)/mtx(3,3);
*use yellow change to solve G and R equations for cyan
and magenta changes*/
delta_M_g = (err(2) - mtx(2,3)*delta_Y_b)/mtx(2,2);
delta_C_r = (err(1) - mtx(1,3)*delta_Y_b)/mtx(1,1);
end;
```

The following pseudo-code routine shown in Table 4 below can be used, within block 1080, to calculate, through direct solution of equation (15), the recommended changes in the tint densities for the process colors C, M and Y. Inasmuch as changes in L*a*b* coordinates arising from changes in tint density are obtained primarily from dot area changes, i.e., fractional coverage changes, a dot area dependent version of the combined process model and match principle equation (15) is used. To facilitate computation, the inverse of the coefficient matrix obtained from empirical data at a variety of dot area levels is fit by a cubic polynomial in fractional coverage. The pseudo-code shown in Table 4 below includes this dot area dependent definition of the inverse of the coefficient matrix, i.e. "tintinv".

TABLE 4
PSEUDO-CODE FOR C, M, Y RECOMMENDED TINT DENSITY CHANGES PROCEDURE variable names and meanings

| | |
|---|---|
| sens_zero | 3 ×3 matrix of inverse sensitivity (model) coefficients |
| sens_one | 3×3 matrix of inverse sensitivity (model) coefficients |
| sens_two | 3×3 matrix of inverse sensitivity (model) coefficients |
| sens_three | 3×3 matrix of inverse sensitivity (model) coefficients |
| coverage | fractional coverage of tint |
| coeff_zero | coverage coefficient of sens_zero |
| coeff_one | coverage coefficient of sens_one |
| coeff_two | coverage coefficient of sens_two |
| coeff_three | coverage coefficient of sens_three |
| tintinv | coverage dependent 3×3 matrix of inverse sensitivity coefficients |
| N_Lstar_target | L* coordinate for target 3-color tint |
| N_astar_target | a* coordinate for target 3-color tint |
| N_bstar_target | b* coordinate for target 3-color tint |
| N_Lstar_proof | L* coordinate for proof 3-color tint |
| N_astar_proof | a* coordinate for proof 3-color tint |
| N_bstar_proof | b* coordinate for proof 3-color tint |
| delta_c_r | recommended change in cyan tint density |
| delta_M_g | recommended change in magenta tint density |
| delta_Y_b | recommended change in yellow tint density |
| err(3) | vector of L*a*b* differences          */ |

```
sens_zero = [[-.012,-.009,-.004],
             [-.010,  .005,  .003],
```

TABLE 4-continued
PSEUDO-CODE FOR C, M, Y RECOMMENDED TINT DENSITY CHANGES PROCEDURE

```
                [-.005,-.002,  .005]];
sens_one =   [[-.005,-.006,  .001],
              [-.001,  .014,  .002],
              [-.006,-.005,  .018]];
sens_two =   [[-.025,-.007,-.003],
              [-.015,  .007,  .001],
              [-.003,  .010,  .016]];
sens_three = [[-.019,-.015,-.001],
              [-.016,  .013,  .002],
              [-.012,-.016,10 .011]];
coeff_zero =  (1.0 - coverage)**3;
coeff_one =   coverage*(1.0 - coverage)**2;
coeff_two =   (1.0-coverage)*coverage**2;
coeff_three = coverage**3;
for i=1 to 3;
    for j=1 to 3;
        tintinv(i,j) =  coeff_zero*sens_zero(i,j) +
                        coeff_one*sens_one(i,j) +
                        coeff_two*sens_two(i,j) +
                        coeff_three*sens_three(i,j);
    end;
end;
delta_C_r = 0.0;
delta_M_g = 0.0;
delta_Y_b = 0.0;
err(1) = N_Lstar_target - N_Lstar_proof;
err(2) = N_astar_target - N_astar_proof;
err(3) = N_bstar_target - N_bstar_proof;
for j = 1:3;
    delta_C_r = delta_C_r + tintinv(1,j)*err(j);
    delta_M_g = delta_M_g + tintinv(2,j)*err(j);
    delta_Y_b = delta_Y_b + tintinv(3,j)*err(j);
end;
end;
```

Through experimentation using a direct digital color proofing system of the type described in the '940 Spence application, I have found that, through use of my invention, the number of proofs needed to obtain an acceptable appearance match and thereby calibrate the proofing system to a press or to proofs from alternative proofing systems can be reduced from 12-15 successive proofs, as had traditionally occurred in the art, to between 2-4 such proofs (even with using somewhat inaccurate sensitivity coefficients) and in many instances to just one proof. As such, my method provides a significant savings in time, cost and material as well as requiring far less expertise of a technician than has heretofore been necessary. Furthermore, I have experimentally confirmed that my methodology does indeed produce a proof which matches a press sheet in terms of three-color overprint tone scale, critical aspects of three-color, red and green solids and a black printer tone scale—all of which together provide an acceptable appearance match.

By now it should be readily apparent to those skilled in the art that the broad principles of my invention are applicable to objectively obtaining an appearance match between two of a wide variety of different imaging systems and therethrough to calibrate the tone and color response characteristics of one of these systems to those of another such system. By doing so, a replica image, such as a proof as described above, made by one of these systems, e.g. a proofer, will be an accurate appearance match to a desired target image, such as a press sheet, of that particular image but made by the other such system, such as illustratively a printing press. In order to calibrate any such system to another, the matching principles set forth above, in all likelihood, would need to be appropriately changed based on color response of the two systems and associated imaging media and the reproducible color gamuts obtainable therethrough as well as on the judgmental response of the observer. For example, rather than matching the three-color overprint solid achromatic value and tint achromatic and chromatic coordinates and two-color (for red and green) hue angles as described above, then, depending on the characteristics of the imaging systems, full scale three-color overprint color coordinate matching (solid included) or alternatively full scale three-color overprint achromatic scaling coupled with red and green hue angle matching could be used. Furthermore, as different "replica" imaging systems and imaging media are used, the specific model that is used to represent the "replica" imaging system would also change in order to accurately characterize its response to changes in its operating conditions or settings. Such a change, for a localized linearized model, might entail use of different empirically determined sensitivity coefficients and/or different linearized equations given the process colorants that are to be used. Furthermore, if a increasingly complicated model, such as quadratic, cubic or other localized fits or even non-localized modeling, were to be used, then the modeling equations and associated coefficients would change accordingly. Regardless of the specific model to be used, that model would be combined with appearance based matching principles in order to modify tone and color rendition produced in the replica according to these principles and the tone and color rendition obtained from a common source in the target so that, given the judgmental preferences of the observer and any performance limitations of the replica imaging system, the operational settings (and thereby the tone and color reproduction characteristics) of the replica imaging system would be altered in a manner which will produce a replica image that is an accurate appearance match to the target image. By combining the model and matching principles through feedback-based equations, a succession of replica images could be made for each target image so that the recommended process color values, either in relative (i.e. changes) or absolute magnitude terms, will iteratively converge, within pre-defined convergence limits, to final values. As such, measurements would be taken of corresponding portions of a target image and the replica and fed back as input into the feedback-based equations to generate a new set of process color values. A new replica image would be generated using these values with appropriate measurements being taken of this image, and so on until the values appropriately converged. I fully expect that my inventive technique will likely provide operational settings that will produce an accurate objective appearance match, across many different imaging systems, in significantly less time and cost and requiring substantially less user expertise than trial-and-error methods, currently in use, or even quantified overall colorimetric techniques. Although appreciable time reductions occur even with use of relatively inaccurate models, convergence will occur in even less time (i.e. at an increased rate) and hence through use of fewer replica images as increasingly accurate models are used of the replica imaging system.

Although one embodiment of the present invention has been shown and described in detail herein, many other varied embodiments that incorporate the teachings of my invention may be easily constructed by those skilled in the art.

INDUSTRIAL APPLICABILITY AND ADVANTAGES

The present invention is useful in connection with a wide variety of different imaging systems, such as a color halftone proofing system, for objectively and automatically providing an appearance match between corresponding color depictions of a common image, such as a press sheet and a proof therefor, produced by two such differing systems. Through use of the invention in, for example, a direct digital color proofing system, the tasks of establishing an appearance match between a press sheet and a corresponding proof and calibrating the proofing system to the press can both be accomplished in significantly less time, with significantly less cost and with significantly less expertise than have heretofore been required in the past.

I claim:

1. In imaging apparatus having first and second different imaging systems, wherein said first and second imaging systems generate respective first and second image depictions of a common original image, wherein said first imaging system comprises either a press or a first proofing system and said first image depiction comprises a target image; and said second imaging system comprises a second proofing system and said second image depiction comprises a proof image, a method for obtaining an appearance match between said first and second image depictions and for generating operational settings for said second imaging system so as to calibrate a response of the second imaging system to a response of the first imaging system, the method comprising the steps of:

obtaining data values for corresponding portions of said first and second image depictions in a predetermined manner that substantially parallels color perception of a viewer; and determining, in response to said data values and through a pre-defined model of said second imaging system and pre-determined matching principles, operational settings for said second imaging system to produce an image, through said second imaging system, that is an appearance match to said first image depiction, wherein said matching principles comprise a plurality of pre-defined rules that collectively define an appearance match between corresponding image depictions produced by said first and second imaging systems in response to a common source image applied to both systems.

2. The method in claim 1 wherein said data obtaining step comprises the step of measuring corresponding portions of the first and second image depictions through a densitometer, colorimeter or spectrophotometer.

3. The method in claim 2 wherein said measuring step comprises the step of producing the data values for said corresponding portions of said first and second image depictions in a CIELAB coordinate space.

4. The method in claim 3 wherein said producing step further comprises the steps of:

obtaining tristimulus measurement values (X,Y,Z) for each of said corresponding portions; and converting said tristimulus values into corresponding CIELAB L*a*b* values through the following equations:

$$L^* = 116\left(\sqrt[3]{\frac{Y}{Y_n}}\right) - 16$$

$$a^* = 500\left(\sqrt[3]{\frac{X}{X_n}} - \sqrt[3]{\frac{Y}{Y_n}}\right)$$

$$b^* = 200\left(\sqrt[3]{\frac{Y}{Y_n}} - \sqrt[3]{\frac{Z}{Z_n}}\right)$$

where: $(X_n, Y_n, Z_n)$ are tristimulus values for a reference white illuminant.

5. The method in claim 4 further comprising the steps of:
   (a) obtaining, from associated portions of the target image, colorimetric data for: media density, three-color solid overprint densities, red and green solid overprint densities, densities of a pre-defined halftone dot size for three-color tints, and densities for a black solid and a black tint;
   (b) obtaining, from corresponding portions of the proof image, colorimetric data corresponding to all the data set forth in step (a) above;
   (c) generating, through first associated corresponding ones of the colorimetric data obtained through steps (a) and (b) above and in a first pre-defined manner, recommended changes in solid area densities for each of a plurality of process colors;
   (d) generating, through second associated corresponding ones of the colorimetric data obtained through steps (a) and (b) above and in a second pre-defined manner, recommended changes in halftone dot size for each of the process colors;
   (e) generating, through third associated corresponding ones of the colorimetric data obtained through steps (a) and (b) above and in a third pre-defined manner, recommended changes for solid area density and halftone dot size for black solid and black tint, respectively;
   (f) generating the proof image, through the proofing system, using all the recommended changes provided through steps (b)-(e) above; and
   (g) repeating steps (b)-(f) above until an acceptable appearance match results between the target image and a most recent proof image.

6. The method in claim 5 wherein the pre-defined halftone dot size is substantially 50%.

7. The method in claim 4 wherein the pre-defined model is a linearized model of the response of said second proofing system at a given operating point, said model comprising a plurality of sensitivity coefficients which collectively define changes in expected response of said second proofing system to pre-defined changes in said operating point.

8. The method in claim 7 wherein said pre-determined matching principles comprise:
   (a) for cyan, yellow, and magenta solid process colors:
      first matching an L* coordinate associated with ones of said data values for corresponding three-color solid overprint test patches in both the proof image and the target image;
      second matching, in an a*-b* plane, a hue angle associated with ones of said data values for corresponding solid red test patches in both the proof image and the target image;
      third matching, in an a*-b* plane, a hue angle associated with ones of said data values for corresponding solid green test patches in both the proof image and the target image; and
   (b) for three-color tint overprints:
      fourth matching L*a*b* coordinates at a pre-defined halftone dot size for data values associated with corresponding three-color tint overprint test patches in both the proof image and the target image; and
   (c) for solid black and black tint;
      fifth matching an L* coordinate associated with corresponding solid black and black tint test patches in both the proof image and the target image.

9. The method in claim 8 wherein said first matching step comprises the step of matching an L* coordinate in the L*a*b* coordinate space associated with said ones of said data values for the corresponding three-color overprint test patches in both the proof image and the target image according to the following equation:

$$N_L^{T*} = (N_L^{P*} + \Delta N_L^*)$$

wherein
$N_L^{*P}$ represents an L* coordinate value for the near neutral overprint in the proof image;
$N_L^{*T}$ represents an L* coordinate value for the near neutral overprint in the target image;
$\Delta N_L^*$ represents a resulting correction needed in a three-color overprint L* coordinate;

wherein said second and third matching steps comprise the steps of matching the hue angle associated with ones of said data values for the corresponding solid red and green test patches in both the proof image and the target image according to the following respective equations:

$$R_a^{T*} \cdot (R_b^{P*} + \Delta R_b^*) = R_b^{T*} \cdot (R_a^{P*} + \Delta R_a^*)$$

$$G_a^{T*} \cdot (G_b^{P*} + \Delta G_b^*) = G_b^{T*} \cdot (G_a^{P*} + \Delta G_a^*)$$

where:
$R_a^{*T}$ and $G_a^{T}$ represent a* coordinate values for solid red and green test patches for the target image;
$R_b^{P}$ and $G_b^{P}$ represent b* coordinate values for solid red and green test patches for the proof image;
$\Delta R_b^*$ and $\Delta G_b^*$ respectively represent a resulting correction needed in the red and green b* coordinate values;
$R_b^{*T}$ and $G_b^{*T}$ represent b* coordinate values for solid red and green test patches for the target image;
$R^{a*P}$ and $G_a^{*P}$ represent a* coordinate values for solid red and green test patches for the proof image; and
$\Delta R_a^*$ and $\Delta G_a^*$ respectively represent a resulting correction needed in the red and green a* coordinate values;

wherein said fourth matching step comprises the step of matching the tint coordinates ($N_L^*$, $N_a^*$, $N_b^*$) for data values associated with the corresponding three-color overprint test patches in both the proof image and the target image according to the following equations evaluated at the pre-defined halftone dot size:

$$N_L^{T*} = (N_L^{P*} + \Delta N_L^*)$$

$$N_a{}^{T*} = (N_a{}^{P*} + \Delta N_a{}^*)$$

$$N_b{}^{T*} = (N_b{}^{P*} + \Delta N_b{}^*);$$

where:

$N_L{}^{*T}$, $N_a{}^{*T}$ and $N_b{}^{*T}$ respectively represent L*, a* and b* coordinate values for three-color overprint patches of the target image;

$N_L{}^{*P}$, $N_a{}^{*P}$ and b respectively represent L*, a* and b* coordinate values for three-color overprint patches of the proof image; and $\Delta N_L{}^*$, $\Delta N_a{}^*$ and $\Delta N_b{}^*$ respectively represent resulting corrections needed in the L*, a* and b* coordinate values for three-color overprint patches of the proof image; and wherein said fifth matching step comprises the step of separately matching the L* coordinate value for data values associated with the corresponding solid black and black tint test patches, the latter at the pre-defined halftone dot size, in both the proof image and the target image, both according to the following equation:

$$K_L{}^{T*} = (K_L{}^{P*} + \Delta K_L{}^*)$$

where:

$K_L{}^*$ represents an L* coordinate value for solid or tint black density;

superscripts T or P representing the target image or proof image; and $\Delta K$ represents a resulting correction in solid or tint black L* coordinate value, respectively.

10. The method in claim 9 wherein the pre-defined halftone dot size is substantially 50%.

11. The method in claim 7 wherein said changes in said operating point comprise changes in solid area density values of cyan, yellow, magenta or black process colors or halftone dot sizes associated with any one of said process colors.

12. The method in claim 11 wherein said pre-defined model is given by the following equations:

(a) for three-color (red, green and blue) solid overprints:

$$\Delta N_L{}^* = [S_{NL*}] \begin{bmatrix} \Delta C_r \\ \Delta M_g \\ \Delta Y_b \end{bmatrix}$$

where:

$\Delta C_r$ represents the change in cyan process color solid area density for red light;

$\Delta M_g$ represents the change in magenta process color solid area density for green light;

$\Delta Y_b$ represents the change in yellow process color solid area density for blue light; and $\Delta N_L{}^*$ represents a resulting change in an L* coordinate value for a three color overprint;

(b) for red and green solid colors:

$$\begin{bmatrix} \Delta R_{a*} \\ \Delta R_{b*} \end{bmatrix} = \begin{bmatrix} S_{Ra*} \\ S_{Rb*} \end{bmatrix} \begin{bmatrix} \Delta C_r \\ \Delta M_g \\ \Delta Y_b \end{bmatrix}$$

-continued $$\begin{bmatrix} \Delta G_{a*} \\ \Delta G_{b*} \end{bmatrix} = \begin{bmatrix} S_{Ga*} \\ S_{Gb*} \end{bmatrix} \begin{bmatrix} \Delta C_r \\ \Delta M_g \\ \Delta Y_b \end{bmatrix}$$

where:

$\Delta G$ and $\Delta R$ represent resulting changes in green and red coordinates (with subscripts a* and b* denoting a* and b* coordinates, respectively);

(c) for three-color tint overprints $$\begin{bmatrix} \Delta N_{L*} \\ \Delta N_{a*} \\ \Delta N_{b*} \end{bmatrix} = \begin{bmatrix} S_{NL*} \\ S_{Na*} \\ S_{Nb*} \end{bmatrix} \begin{bmatrix} \Delta C_r \\ \Delta M_g \\ \Delta Y_b \end{bmatrix}$$

where:

$\Delta N$ represents a resulting change in three-color coordinates (with subscripts L* *, a and b* denoting L*, a* and b* coordinates, respectively);

$\Delta C_r$ represents the change in cyan process color tint density for red light;

$\Delta M_g$ represents the change in magenta process color tint density for green light;

$\Delta Y_b$ represents the change in yellow process color tint density for blue light;

and (d) for black solids and tints:

$$\Delta K_{L*} = -(K_{L*}^P + 16)(1 - 10^{-\Delta K_v/3})$$

where:

$\Delta K_L{}^*$, represents a resulting change in an L* coordinate value for black (K) solid or black tint;

$\Delta K_v$ represents the change in black solid or black tint density; and

S represents a corresponding matrix of sensitivity coefficients.

13. The method in claim 11 wherein said operational settings determining step comprises the step of determining, in response to differences in the measured data values for corresponding portions of said proof image and the target image, changes in process color solid area and tint density values through use of the following equations, wherein said tint density values are for a pre-defined halftone dot size:

$$\begin{bmatrix} G_{b*}^T \cdot S_{Ga*} - G_{a*}^T \cdot S_{Gb*} \\ R_{b*}^T \cdot S_{Ra*} - R_{a*}^T \cdot S_{Rb*} \\ S_{NL*} \end{bmatrix} \begin{bmatrix} \Delta C_r \\ \Delta M_g \\ \Delta Y_b \end{bmatrix} =$$

$$\begin{bmatrix} G_{a*}^T G_{b*}^P - G_{b*}^T G_{a*}^P \\ R_{a*}^T R_{b*}^P - R_{b*}^T R_{a*}^P \\ N_{L*}^T - N_{L*}^P \end{bmatrix}$$

-continued $$\begin{bmatrix} S_{NL^*} \\ S_{Na^*} \\ S_{Nb^*} \end{bmatrix} \begin{bmatrix} \Delta C_r \\ \Delta M_g \\ \Delta Y_b \end{bmatrix} = \begin{bmatrix} N_{L^*}^T - N_{L^*}^P \\ N_{a^*}^T - N_{a^*}^P \\ N_{b^*}^T - N_{b^*}^P \end{bmatrix}$$

$$\Delta K_v = -3\log_{10}\left(\frac{K_{L^*}^T + 16}{K_{L^*}^P + 16}\right)$$

where:
$R_a^{*T}$, $G_a^{*T}$ and $N_a^{*T}$ respectively represent for the target image, a* coordinate values for red and green solid areas and three-color overprint tint areas;

$R_a^{*P}$, $G_a^{*P}$ and respectively represent, for the proof image, a* coordinate values for red and green solid areas and the three-color overprint tint areas for the proof image;

$R_b^{*T}$, $G_b^{*T}$ and $N_b^{*T}$ respectively represent, for the target image, b* coordinate values for red and green solid areas and for the three-color overprint tint areas;

$R_b^{*P}$, $G_b^{*P}$ and $N_b^{*P}$ respectively represent, for the proof image, b* coordinate values for red and green solid areas and for the three-color overprint tint area; and $K_L^{*T}$ and $K_L^{*P}$ respectively represent L* coordinate values for solid or tint density of black in the target and proof images.

14. The method in claim 13 wherein said operational settings determining step further comprises the step of converting said changes in the three-color overprint and black tint density values into corresponding halftone dot sizes (DA) through either of the following equations:

$$DA = 100 \frac{1 - 10^{(D_{min} - D_{tint})/n}}{1 - 10^{(D_{min} - D_{max})/n}} \text{ or}$$

$$\Delta DA = S_{area} \Delta D_{tint}$$

where:
DA is dot area in percent;
$D_{min}$ is the media density;
$D_{max}$ is solid area density;
$D_{tint}$ is tint density;
$S_{area}$ is a pre-defined area sensitivity factor; and is an optical gain adjustment factor.

15. The method in claim 14 wherein said changes determining step comprises the step of ascertaining said changes in the tint density values at each one of a plurality of pre-determined setpoints, each of said setpoints being a different corresponding halftone dot size for a common one of said process colors.

16. The method in claim 15 wherein said ascertaining step comprises the steps of interpolating the changes for said tint density values for any of said process colors, in terms of halftone dot size, to yield interpolated tint density changes so as to yield interpolated change values for all possible input dot areas associated with said process color.

17. The method in claim 16 wherein said interpolating step comprises the steps of:
determining coefficients of a monotone piecewise cubic function that spans an interval defined by each pair of adjacent ones of said changes in the tint density values; and
evaluating the monotone piecewise cubic function for each such interval at pre-defined incremental input dot areas that fall on the ends of or within that interval so as to collectively yield the interpolated changes.

18. Apparatus for obtaining an appearance match between said first and second image depictions of a common original image and produced by first and second imaging systems, respectively, wherein said first imaging system comprises either a press or a first proofing system and said first image depiction comprises a target image; and said second imaging system comprises a second proofing system and said second image depiction comprises a proof image, and for generating operational settings for said second imaging system so as to calibrate a response of the second imaging system to a response of the first imaging system, the apparatus comprising:
means for obtaining data values for corresponding portions of said first and second image depictions in a pre-determined manner that substantially parallels color perception of a viewer; and
means for determining, in response to said data values and through a pre-defined model of said second imaging system and pre-determined matching principles, operational settings for said second imaging system to produce an image, through said second imaging system, that is an appearance match to said first image depiction, wherein said matching principles comprise a plurality of pre-defined rules that collectively define an appearance match between corresponding image depictions produced by said first and second imaging systems in response to a common source image applied to both systems.

19. The apparatus in claim 18 wherein said data obtaining means comprises means for measuring corresponding portions of the first and second image depictions through a densitometer, colorimeter or spectrophotometer.

20. The apparatus in claim 19 wherein said measuring means comprises means for producing the data values for said corresponding portions of said first and second image depictions in a CIELAB coordinate space.

21. The apparatus in claim 20 wherein said producing means further comprises means for obtaining tristimulus measurement values (X,Y,Z) for each of said corresponding portions and for converting said tristimulus values into corresponding CIELAB L*a*b* values.

22. The apparatus in claim 21 further comprising:
first means for obtaining, from associated portions of the target image, colorimetric data for: media density, three-color solid overprint densities, red and green solid overprint densities, densities of a pre-defined halftone dot size for three-color tints, and densities for a black solid and a black tint;
second means for obtaining, from corresponding portions of the proof image, colorimetric data corresponding to the data provided by said first obtaining means;
first means for generating, through first associated corresponding ones of the colorimetric data obtained through said first and second obtaining means and in a first pre-defined manner, recommended changes in solid area densities for each of a plurality of process colors;

second means for generating, through second associated corresponding ones of the colorimetric data obtained through said first and second obtaining means and in a second pre-defined manner, recommended changes in halftone dot size for each of the process colors; and third means for generating, through third associated corresponding ones of the colorimetric data obtained through said first and second obtaining means and in a third pre-defined manner, recommended changes for solid area density and halftone dot size for black solid and black tint, respectively.

23. The apparatus in claim 22 wherein the pre-defined halftone dot size is substantially 50%.

24. The apparatus in claim 22 wherein the pre-defined model is a linearized model of the response of said second proofing system at a given operating point, said model comprising a plurality of sensitivity coefficients which collectively define changes in expected response of said second proofing system to pre-defined changes in said operating point.

25. The apparatus in claim 24 wherein said pre-determined matching principles comprise:

(a) for cyan, yellow, and magenta solid process colors:

first matching an L* coordinate associated with ones of said data values for corresponding three-color solid overprint test patches in both the proof image and the target image;

second matching, in an a*-b* plane, a hue angle associated with ones of said data values for corresponding solid red test patches in both the proof image and the target image;

third matching, in an a*-b* plane, a hue angle associated with ones of said data values for corresponding solid green test patches in both the proof image and the target image; and (b) for three-color tint overprints:

fourth matching L*a*b* coordinates at a pre-defined halftone dot size for data values associated with corresponding three-color tint overprint test patches in both the proof image and the target image; and (c) for solid black and black tint;

fifth matching an L* coordinate associated with corresponding solid black and black tint test patches in both the proof image and the target image.

26. The apparatus in claim 24 wherein said changes in said operating point comprise changes in solid area density values of cyan, yellow, magenta or black process colors or halftone dot sizes associated with any one of said process colors.

27. The apparatus in claim 26 wherein said operational settings determining means comprises means for determining, in response to differences in the measured data values for corresponding portions of said proof image and the target image, changes in process color solid area and tint density values through use of the following equations, wherein said tint density values are for a pre-defined halftone dot size:

$$\begin{bmatrix} G_{b*}^T \cdot S_{Ga*} - G_{a*}^T \cdot S_{Gb*} \\ R_{b*}^T \cdot S_{Ra*} - R_{a*}^T \cdot S_{Rb*} \\ S_{NL*} \end{bmatrix} \begin{bmatrix} \Delta C_r \\ \Delta M_g \\ \Delta Y_b \end{bmatrix} =$$

-continued $$\begin{bmatrix} G_{a*}^T G_{b*}^P - G_{b*}^T G_{a*}^P \\ R_{a*}^T R_{b*}^P - R_{b*}^T R_{a*}^P \\ N_{L*}^T - N_{L*}^P \end{bmatrix}$$

$$\begin{bmatrix} S_{NL*} \\ S_{Na*} \\ S_{Nb*} \end{bmatrix} \begin{bmatrix} \Delta C_r \\ \Delta M_g \\ \Delta Y_b \end{bmatrix} = \begin{bmatrix} N_{L*}^T - N_{L*}^P \\ N_{a*}^T - N_{a*}^P \\ N_{b*}^T - N_{b*}^P \end{bmatrix}$$

$$\Delta K_y = -3\log_{10}\left(\frac{K_{L*}^T + 16}{K_{L*}^P + 16}\right)$$

where:

$R_a^{*T}$, $G_a^{*T}$ and $N_a^{*T}$ respectively represent, for the target image, a* coordinate values for red and green solid areas and three-color overprint tint areas;

$R_a^{*P}$, $G_a^{*P}$ and $N_a^{*P}$ respectively represent, for the proof image, a* coordinate values for red and green solid areas and the three-color overprint tint areas for the proof image;

$R_b^{*T}$, $G_b^{*T}$ and $N_b^{*T}$ respectively represent, for the target image, b* coordinate values for red and green solid areas and for the three-color overprint tint areas;

$R_b^{*P}$, $G_b^{*P}$ and $N_b^{*P}$ respectively represent, for the proof image, b* coordinate values for red and green solid areas and for the three-color overprint tint area; and $K_L^{*T}$ and $K_L^{*P}$ respectively represent L* coordinate values for solid or tint density of black in the target and proof images.

28. The apparatus in claim 27 wherein said operational settings determining means further comprises means for converting said changes in the three-color overprint and black tint density values into corresponding halftone dot sizes (DA) through either of the following equations:

$$DA = 100 \frac{1 - 10^{(D_{min}-D_{tint})/n}}{1 - 10^{(D_{min}-D_{max})/n}} \text{ or}$$

$$\Delta DA = S_{area} \Delta D_{tint}$$

where:

DA is dot area in percent;
$D_{min}$ is the media density;
$D_{max}$ is solid area density;
$D_{tint}$ is tint density;
$S_{area}$ is a pre-defined area sensitivity factor; and
n is an optical gain adjustment factor.

29. The apparatus in claim 28 wherein said changes determining means comprises means for ascertaining said changes in the tint density values at each one of a plurality of pre-determined setpoints, each of said setpoints being a different corresponding halftone dot size for a common one of said process colors.

30. The apparatus in claim 29 wherein said ascertaining means comprises means for interpolating the changes for said tint density values for any of said process colors, in terms of halftone dot size, to yield interpolated tint density changes so as to yield interpolated change values for all possible input dot areas associated with said process color.

31. The apparatus in claim 30 wherein said interpolating means comprises:

means for determining coefficients of a monotone piecewise cubic function that spans an interval defined by each pair of adjacent ones of said changes in the tint density values; and means for evaluating the monotone piecewise cubic function for each such interval at pre-defined incremental input dot areas that fall on the ends of or within that interval so as to collectively yield the interpolated changes.

* * * * *